United States Patent
Ueno et al.

(10) Patent No.: US 8,778,233 B2
(45) Date of Patent: *Jul. 15, 2014

(54) DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

(75) Inventors: Shigehiro Ueno, Tokyo-to (JP); Keisuke Hashimoto, Tokyo-to (JP); Masato Okada, Tokyo-to (JP); Seiji Take, Tokyo-to (JP); Yosuke Taguchi, Tokyo-to (JP); Masataka Kano, Tokyo-to (JP); Shin-ya Fujimoto, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,700

(22) Filed: Apr. 30, 2012

(65) Prior Publication Data

US 2012/0211705 A1      Aug. 23, 2012

Related U.S. Application Data

(63) Continuation of application No. 12/989,732, filed as application No. PCT/JP2009/058405 on Apr. 28, 2009.

(30) Foreign Application Priority Data

Apr. 28, 2008    (JP) ................................ 2008-117571

(51) Int. Cl.
    *H01B 1/12*        (2006.01)
(52) U.S. Cl.
    USPC ... 252/519.34; 252/512; 252/515; 252/519.3; 252/519.31; 257/40
(58) Field of Classification Search
    USPC ............ 252/519.34, 512, 515, 519.3, 519.31; 257/40
    See application file for complete search history.

(56) References Cited

U.S. PATENT DOCUMENTS

| 6,111,274 | A * | 8/2000 | Arai | .................. 257/96 |
| 7,764,014 | B2 | 7/2010 | Yoshida et al. | |
| 2005/0142383 | A1* | 6/2005 | Igarashi et al. | ............... 428/690 |
| 2006/0292394 | A1 | 12/2006 | Iwaki et al. | |
| 2007/0241665 | A1 | 10/2007 | Sakanoue et al. | |
| 2009/0220705 | A1 | 9/2009 | Mizuno et al. | |
| 2009/0284135 | A1 | 11/2009 | Yoshida et al. | |
| 2010/0237322 | A1* | 9/2010 | Okada et al. | ..................... 257/13 |
| 2011/0037065 | A1 | 2/2011 | Ueno et al. | |
| 2011/0163327 | A1* | 7/2011 | Ueno et al. | ...................... 257/79 |
| 2012/0119201 | A1* | 5/2012 | Ueno et al. | ...................... 257/40 |
| 2012/0138916 | A1* | 6/2012 | Ueno et al. | ...................... 257/40 |
| 2012/0146010 | A1* | 6/2012 | Ueno et al. | ...................... 257/40 |

FOREIGN PATENT DOCUMENTS

| JP | 09-063771 A | 3/1997 |
| JP | 11-283750 A | 10/1999 |
| JP | 2000-036390 A | 2/2000 |
| JP | 2002-204012 A | 7/2002 |
| JP | 2002-305078 A | 10/2002 |
| JP | 2006-036889 A | 2/2006 |
| JP | 2006-114521 A | 4/2006 |
| JP | 2006-144002 A | 6/2006 |
| JP | 2006-155978 A | 6/2006 |
| JP | 2006-190995 A | 7/2006 |
| JP | 2007-150226 A | 6/2007 |
| JP | 2007-287586 A | 11/2007 |
| JP | 2008-041894 A | 2/2008 |
| JP | 2008-047890 A | 2/2008 |
| WO | 2006/101018 A1 | 9/2006 |

OTHER PUBLICATIONS

Tsunenori Suzuki, et al; "69.3: Polymer/Metal-Oxide Composite: A Novel Buffer Layer for Solution-Processible OLEDs", SID 07 Digest, pp. 1840-1843.
European Search Report: dated Jan. 25, 2012; Appln. No. EP 09 73 8840.
International Search Report; mailed Jun. 2, 2009; PCT/JP2009/058405.
USPTO NFOA dated Sep. 16, 2013 in connection with U.S. Appl. No. 12/989,729.
USPTO NFOA dated Oct. 3, 2013 in connection with U.S. Appl. No. 12/989,732.
USPTO FOA dated Mar. 7, 2014 in connection with U.S. Appl. No. 12/989,729.

* cited by examiner

*Primary Examiner* — Douglas McGinty
(74) *Attorney, Agent, or Firm* — Ladas & Parry LLP

(57) ABSTRACT

The present invention is to provide a device capable of having an easy production process and achieving a long lifetime. A device comprising a substrate, two or more electrodes facing each other disposed on the substrate and a positive hole injection transport layer disposed between two electrodes among the two or more electrodes, wherein the positive hole injection transport layer comprises a transition metal-containing nanoparticle containing at least a transition metal compound including a transition metal oxide, a transition metal and a protecting agent, or at least the transition metal compound including the transition metal oxide, and the protecting agent.

6 Claims, 4 Drawing Sheets

DEVICE COMPRISING POSITIVE HOLE INJECTION TRANSPORT LAYER, METHOD FOR PRODUCING THE SAME AND INK FOR FORMING POSITIVE HOLE INJECTION TRANSPORT LAYER

TECHNICAL FIELD

The present invention relates to a device comprising a positive hole injection transport layer including an organic device such as an organic electroluminescent element, and a quantum dot light emitting element, a method for producing the same, and an ink for forming the positive hole injection transport layer.

BACKGROUND ART

It is expected that a device using an organic substance develops to a wide range of elementary elements such as an organic electroluminescent element (hereinafter referred to as an organic EL element), an organic transistor, an organic solar battery, and an organic semiconductor and uses. In addition to the above devices, devices having a positive hole injection transport layer include a quantum dot light emitting element, an oxide compound solar battery, etc.

An organic EL element is a charge injection type self light emitting device, utilizing the light emission generated at the time of recombining an electron and a positive hole reaching at a light emitting layer. Such an organic EL element has been developed actively since 1987 when T. W. Tang, et al. proved that an element comprising laminated thin films of a fluorescent metal chelate complex and a diamine based molecule emits light of high luminance with a low driving voltage.

The element configuration of the organic EL element comprises a cathode/an organic layer/an anode. The organic layer in an initial organic EL element has a two layer structure comprising a light emitting layer and a positive hole injection layer. At present, however, in order to obtain a high light emitting efficiency and a long driving lifetime, various multilayered structures such as a five layer structure comprising an electron injection layer/an electron transport layer/a light emitting layer/a positive hole transport layer/a positive hole injection layer, etc. have been proposed.

It is said that the layers other than the light emitting layer including the electron injection layer, the electron transport layer, the positive hole transport layer and the positive hole injection layer have effects that charges are easily injected and transported to the light emitting layer, the balance between an electronic current and a positive hole current is maintained by blocking charges, and the diffusion of a light energy exciton is prevented.

For the purpose of improving charge transport ability and charge injection ability, there has been attempts to increase electric conductivity by mixing an oxidizing compound to a positive hole transport material (Patent Literatures 1 and 2).

In Patent Literature 1, as the oxidizing compound, that is, an electron accepting compound, a compound containing counter anions such as a triphenylamine derivative and antimony hexafluoride, and a compound having a significantly-high electron-accepting property, in which a cyano group is bonded to carbon of a carbon-carbon double bond, such as 7,7,8,8-tetracyanoquinodimethane, are used.

In Patent Literature 2, as an oxidizing dopant, a general oxidant can be exemplified, and also halogenated metal, Lewis acid, organic acid and salt of arylamine and halogenated metal or Lewis acid can be exemplified.

In Patent Literatures 3 to 6, as the oxidizing compound, that is, the electron accepting compound, a metal oxide being a compound semiconductor is used. For the purpose of obtaining a positive hole injection layer having an excellent injection property and charge transfer property, for example, a thin film is formed by a vapor deposition method using a metal oxide such as vanadium pentoxide or molybdic trioxide, or a mixed film is formed by codeposition of a molybdenum oxide and an amine based low molecular weight compound.

In Patent Literature 7, a solution, in which oxovanadium (V)tri-i-propoxideoxide is dissolved as the oxidizing compound, that is, the electron accepting compound, is used. As an attempt to form a coating film of vanadium pentoxide, Patent Literature 7 discloses a method for forming a charge transfer complex comprising the step of forming a mixed coating film of the solution and a positive hole transport polymer followed by hydrolysis in water vapor to obtain vanadium oxide.

Patent Literature 8 discloses that an organic EL element having a long lifetime is produced by dispersing particles produced by physically pulverizing molybdic trioxide in a solution to produce a slurry, and applying the slurry to form a positive hole injection layer, as an attempt to form a coating film of molybdic trioxide.

On the other hand, an organic transistor is a thin film transistor using an organic semiconductor material comprising an organic polymer or an organic low-molecular compound having a π conjugated system for a channel area. A general organic transistor comprises a substrate, a gate electrode, a gate insulating layer, source and drain electrodes and an organic semiconductor layer. In the organic transistor, by changing a voltage (gate voltage) applied to the gate electrode, a quantity of electric charge of an interface of a gate insulating layer and an organic semiconductor layer is controlled and switching is performed by changing a current value between a source electrode and a drain electrode.

As an attempt to improve an on-current value of the organic transistor and stabilize element characteristic by lowering a charge injection barrier between the organic semiconductor layer and the source electrode or the drain electrode, it is known that the carrier density in the organic semiconductor layer in the vicinity of the electrode is increased by introducing the charge transfer complex to an organic semiconductor (for example, Patent Literature 9).

CITATION LIST

[Patent Literature 1] Japanese Patent Application Laid-Open (JP-A) No. 2000-36390
[Patent Literature 2] Japanese patent No. 3748491
[Patent Literature 3] JP-A No. 2006-155978
[Patent Literature 4] JP-A No. 2007-287586
[Patent Literature 5] Japanese patent No. 3748110
[Patent Literature 6] Japanese patent No. 2824411
[Patent Literature 7] SID 07 DIGEST p. 1,840 to 1,843 (2007)
[Patent Literature 8] JP-A No. 2008-041894
[Patent Literature 9] JP-A No. 2002-204012

SUMMARY OF INVENTION

Technical Problem

However, even if any of oxidizing materials as disclosed in Patent Literatures 1 to 9 is used as a positive hole transport material, an element having a long lifetime is hardly realized, or the lifetime needs to be further extended. The reason thereof is presumed that oxidizing materials disclosed in Patent Literatures 1, 2, 8 and 9 have a low oxidizing ability toward the positive hole transport material, or low dispersing stability in a thin film. For example, in the case that an oxidizing material comprising a cationic triphenylamine derivative and antimony hexafluoride used in both Patent Literature 1 and Patent Literature 2 is mixed with the positive hole transport material, a charge transfer complex is produced, while the same number of free antimony hexafluoride being a counter anion type as the charge transfer complex is present in a thin film. It is assumed that the free antimony hexafluoride migrates upon driving so that materials partially aggregate and precipitate at the interface with an adjacent layer, thus, the dispersing stability of the material in the thin film upon driving decreases. It is considered that such a change of dispersing stability upon driving changes a carrier injection or transport in the element, therefore, it has an adverse effect on lifetime property. In addition, it is considered that metal oxides disclosed in Patent Literatures 3 to 5 improve positive hole injection property, however, it makes the adhesion of the interface to an adjacent organic compound layer insufficient, thus, the metal oxide has an adverse effect on lifetime property.

In addition, there is a problem that the oxidizing materials as disclosed in Patent Literatures 1 to 9 lack versatility since it has insufficient solvent solubility of dissolving at the same time as a positive hole transport polymer compound used to form a film by a solution applying method so that only the oxidizing materials aggregate, and the types of usable solvents are limited. Particularly for a molybdenum oxide being an inorganic compound, there is a problem that although it has a relatively-high property, it is insoluble in a solvent, therefore, the solution applying method cannot be used. For example, Patent Literature 8 discloses that a charge injection layer is produced by a screen printing method using a slurry in which molybdenum oxide particles having an average particle diameter of 20 nm are dispersed in a solvent. However, it is in fact significantly difficult, for example, to produce particles having a uniform particle diameter on a scale of 10 nm or less to satisfy the request for forming a positive hole injection layer having a thickness of about 10 nm by the method of pulverizing $MoO_3$ powder as described in Patent Literature 8. In addition, it is more difficult to stably disperse molybdenum oxide particles produced by pulverization in a solution without aggregation. If the particles are unstably dispersed in a solution, only a film having an unevenness with large difference in height and a poor smoothness can be formed upon forming a coating film, thus, it can cause short circuit of a device. In the case that a thin film can be only formed by a vapor deposition method, there has been a problem of not being able to take advantage of the solution applying method, even if a light emitting layer is formed by coating separately by the solution applying method such as an ink-jet method. That is, to avoid impairing liquid repellency of bulkhead (bank) between the light emitting layers by a molybdenum oxide having lyophilicity, the positive hole injection layer or the positive hole transport layer containing the molybdenum oxide being the inorganic compound is required to be deposited using a very fine mask, and it cannot take advantage of the solution applying method from the viewpoint of cost and yield. Further, the molybdenum oxide being the inorganic compound is an oxygen defect type oxide semiconductor, and as for the electric conductivity, $Mo_2O_5$ having an oxidation number of +5 is a better conductor than $MoO_3$ having an oxidation number of +6 at ordinary temperature, however, it is unstable in the air. Therefore, the compound which can be easily deposited by heating is limited to an oxidized compound having a stable valence such as $MoO_3$ or $MoO_2$.

The film-forming property and the stability of the thin film strongly influence the lifetime property of an element. Generally, the lifetime of an organic EL element is defined as the time in which luminance decreases by half when continuous driving at a constant current, and the longer the time in which luminance decreases by half of the element is, the longer the driving lifetime of the element is.

The present invention has been achieved in view of the above problems. A object of the present invention is to provide a device capable of forming a positive hole injection transport layer by a solution applying method, thus having an easy production process, and capable of achieving a long lifetime.

Solution to Problem

As a result of diligent researches, the inventors of the present invention has found out that by using a transition metal-containing nanoparticle for a positive hole injection transport layer, a positive hole injection transport layer can be formed by a solution applying method, thus a production process is easy, and the positive hole injection transport layer becomes a film having a high stability, which is capable of forming a charge transfer complex, thus improving positive hole injection property, and has an excellent adhesion to an adjacent electrode or organic layer, and the inventors has reached the present invention.

That is, a device of the present invention is a device comprising a substrate, two or more electrodes facing each other disposed on the substrate and a positive hole injection transport layer disposed between two electrodes among the two or more electrodes, wherein the positive hole injection transport layer comprises a transition metal-containing nanoparticle containing at least a transition metal compound including a transition metal oxide, a transition metal and a protecting agent, or at least the transition metal compound including the transition metal oxide, and the protecting agent.

Unlike the case of using a molybdenum oxide being an inorganic compound, the transition metal-containing nanoparticle used for the device of the present invention has an organic part as the protecting agent, and has dispersibility to a solvent. Thus, a thin film can be formed by the solution applying method, therefore, there are many advantages of the production process. On a substrate having a liquid-repellent bank, layers from the positive hole injection transport layer to the light emitting layer can be sequentially formed only by a coating process. Therefore, the above coating process is more simple and has an advantage of producing the device at lower cost, compared with the process as in the case of using the molybdenum oxide being the inorganic compound, including after depositing the positive hole injection layer by a vapor deposition using a very fine mask or the like, forming the positive hole transport layer and the light emitting layer by the solution applying method, and further depositing a second electrode.

Unlike the case of using the molybdenum oxide being the inorganic compound, the nanoparticle containing at least the transition metal oxide (hereinafter, it may be simply referred to as "transition metal-containing nanoparticle") used for the device of the present invention has an organic part in the nanoparticle as the protecting agent, thus, the compatibility with a positive hole transport compound being an organic substance, and the adhesion of an interface to an adjacent organic layer become excellent. In addition, it can be considered that the transition metal or transition metal compound contained in the transition metal-containing nanoparticle have high reactivity, thus, the transition metal-containing nanoparticle easily forms a charge transfer complex. Therefore, the device of the present invention comprising the positive hole injection transport layer containing the transition metal-containing nanoparticle can achieve a low voltage driving, a high power efficiency, and a long lifetime.

In addition, by selecting a type of the protecting agent or modifying the protecting agent in the transition metal-containing nanoparticle, it is easy to multifunctionalize the device of the present invention, including imparting functionalities such as hydrophilicity/hydrophobicity, charge transport property and adhesion.

In the device of the present invention, it is preferable that the transition metal and the transition metal in the transition metal compound contained in the transition metal-containing nanoparticle are at least one kind of metal selected from the group consisting of molybdenum, tungsten, vanadium and rhenium from the viewpoint of lowering driving voltage and extending an element lifetime.

In the device of the present invention, the positive hole injection transport layer may comprise two or more kinds of the transition metal-containing nanoparticles which have different kinds of the transition metal respectively.

In the device of the present invention, it is preferable that an average particle diameter of the transition metal-containing nanoparticle is 15 nm or less from the viewpoint of being capable of forming a thin film, lowering driving voltage and extending the element lifetime.

In the device of the present invention, it is preferable that the positive hole injection transport layer comprises at least the transition metal-containing nanoparticle and the positive hole transport compound from the viewpoint of further lowering driving voltage and extending the element lifetime.

In the device of the present invention, the positive hole injection transport layer may comprise layers in which at least a layer containing the transition metal-containing nanoparticle and a layer containing the positive hole transport compound are laminated.

In the device of the present invention, the positive hole injection transport layer may comprise the layers in which at least the layer containing the transition metal-containing nanoparticle and a layer containing at least the transition metal-containing nanoparticle and the positive hole transport compound are laminated.

In the device of the present invention, it is preferable that the protecting agent in the transition metal-containing nanoparticle contains a linking group which functions to connect the transition metal and/or transition metal compound, and an aromatic hydrocarbon and/or a heterocyclic ring from the viewpoint of further lowering driving voltage and extending the element lifetime.

In the device of the present invention, it is preferable that the protecting agent in the transition metal-containing nanoparticle contains a charge transport group from the viewpoint of further lowering driving voltage and extending the element lifetime.

In the device of the present invention, from the viewpoint of further lowering driving voltage and extending the element lifetime, it is preferable that the positive hole transport compound has a moiety A having a sum atomic weight MA of 100 or more, wherein the protecting agent in the transition metal-containing nanoparticle has, besides the linking group, a moiety B having a sum atomic weight MB of 100 or more, the sum atomic weight MB and the sum atomic weight MA satisfy a relationship of the following formula (I):

$$|MA-MB|/MB \leq 2, \text{ and} \qquad \text{Formula (I)}$$

the sum atomic weight MB is larger than one third of a molecular weight of the protecting agent, and wherein a solubility parameter SA of the moiety A and a solubility parameter SB of the moiety B satisfy a relationship of the following formula (II):

$$|SA-SB| \leq 2 \qquad \text{Formula (II)}$$

In the device of the present invention, it is preferable that the moiety B has the same skeleton as that of the moiety A, or a similar skeleton containing a spacer structure in the same skeleton from the viewpoint of further lowering driving voltage and extending the element lifetime.

In the device of the present invention, from the viewpoint of stability of a film, it is preferable that the liking group is one or more kinds selected from functional groups represented by the following formulae (1a) to (1l):

[Chemical formula 1]

(1-a)

(1-b)

(1-c)

(1-d)

(1-e)

(1-f)

(1-g)

(1-h)

(1-i)

(1-j)

-continued

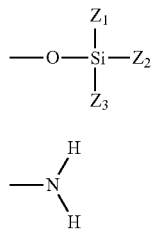

(1-k)

(1-l)

wherein each of $Z_1$, $Z_2$ and $Z_3$ independently represents a halogen atom or an alkoxy group.

In the device of the present invention, it is preferable that the positive hole transport compound is a positive hole transport polymer compound from the viewpoint of further lowering driving voltage and extending the element lifetime.

The device of the present invention is suitably used as an organic EL element comprising an organic layer containing at least a light emitting layer.

A method for producing the device of the present invention is a method for producing a device comprising a substrate, two or more electrodes facing each other disposed on the substrate and a positive hole injection transport layer disposed between two electrodes among the two or more electrodes comprising: a preparation step of preparing an ink for forming the positive hole injection transport layer containing a transition metal-containing nanoparticle containing a transition metal and/or transition metal compound and a protecting agent, and an organic solvent; a formation step of forming the positive hole injection transport layer on any of layers on the electrodes using the ink for forming the positive hole injection transport layer; and an oxidation step of oxidizing at least a part of the transition metal and/or transition metal compound in the transition metal-containing nanoparticle to produce a transition metal oxide.

According to the method for producing the device of the present invention, it is possible to provide a device capable of forming the positive hole injection transport layer by the solution applying method, thus having an easy production process, and capable of achieving the long lifetime.

In the method for producing the device of the present invention, the oxidation step may be performed after preparing the ink for forming the positive hole injection transport layer before or after forming the positive hole injection transport layer.

That is, one embodiment of the method for producing the device of the present invention comprises: the formation step of forming the positive hole injection transport layer containing the transition metal-containing nanoparticle containing the transition metal and/or transition metal compound and the protecting agent on any of the layers on the electrodes; and the oxidation step of oxidizing at least a part of the transition metal and/or transition metal compound in the transition metal-containing nanoparticle in the positive hole injection transport layer to produce the transition metal oxide.

Another embodiment of the method for producing the device of the present invention comprises the oxidation step being performed after preparing the ink for forming the positive hole injection transport layer before forming the positive hole injection transport layer so that the positive hole injection transport layer is formed using the oxidized ink for forming the positive hole injection transport layer.

In the device of the present invention, it is preferable that the oxidation step is performed in the presence of oxygen.

In the method for producing the device of the present invention, a heating process and/or a light irradiation process and/or a process of using active oxygen can be used as the oxidation step.

The ink for forming the positive hole injection transport layer of the present invention comprises the transition metal-containing nanoparticle containing the transition metal and/or transition metal compound and the protecting agent, and an organic solvent.

In the device of the present invention, the transition metal-containing nanoparticle may contain at least the transition metal oxide.

Advantageous Effects of Invention

The device of the present invention is capable of having an easy production process and achieving a long lifetime.

According to the method for producing the device of the present invention, it is possible to provide a device capable of having an easy production process and achieving a long lifetime.

In addition, according to the ink for forming the positive hole injection transport layer of the present invention, it is possible to provide a device capable of having an easy production process and achieving a long lifetime.

REFERENCE SIGNS LIST

Figure 1:
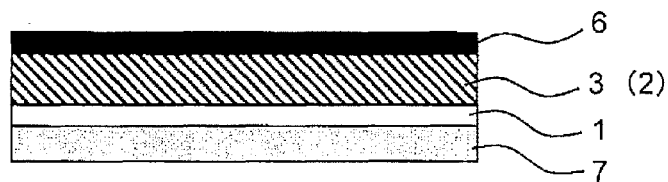
FIG. 1 is a sectional schematic diagram showing a basic constitution of layers of the device of the present invention.

1: electrode
2: positive hole injection transport layer
3: organic layer
4*a*: positive hole transport layer
4*b*: positive hole injection layer 5: light emitting layer
6: electrode
7: substrate
8: organic semiconductor layer
9: electrode
10: insulating layer

DESCRIPTION OF EMBODIMENTS

1. Device

A device of the present invention comprises a substrate, two or more electrodes facing each other disposed on the substrate and a positive hole injection transport layer disposed between two electrodes among the two or more electrodes, wherein the positive hole injection transport layer comprising a transition metal-containing nanoparticle containing at least a transition metal compound including a transition metal oxide, a transition metal and a protecting agent, or at least the transition metal compound including the transition metal oxide, and the protecting agent.

The device of the present invention can achieve a long lifetime of an element since the positive hole injection transport layer can be a film having a high stability, which improves positive hole injection property and has an excellent adhesion to an adjacent electrode or organic layer by containing the transition metal-containing nanoparticle. In addition, unlike the case of using a transition metal oxide being an inorganic compound, the device of the present invention has an organic part in the nanoparticle as the protecting agent which protects the surface of the particle, and has dispersibility to a solvent, thus, a thin film can be formed by a solution applying method. Therefore, the device of the present invention has an easy production process.

As described above, the transition metal-containing nanoparticle used for the device of the present invention can extend the lifetime. The reason thereof is assumed that the transition metal or transition metal compound contained in the transition metal-containing nanoparticle has high reactivity, and the transition metal-containing nanoparticle easily forms a charge transfer complex with a positive hole transport compound or the transition metal-containing nanoparticle. In addition, unlike the transition metal oxide being the inorganic compound, the transition metal-containing nanoparticle has the organic part in the nanoparticle as the protecting agent, thus, the compatibility with a positive hole transport compound being an organic substance becomes excellent, and the adhesion of an interface to an adjacent organic layer becomes excellent. It can be assumed that, therefore, the device of the present invention comprising the positive hole injection transport layer containing the transition metal-containing nanoparticle can achieve a low voltage driving, a high power efficiency, and a particularly long lifetime.

In addition, in the device of the present invention, by selecting a type of the protecting agent or modifying the protecting agent in the transition metal-containing nanoparticle, it is easy to multifunctionalize the device of the present invention, including imparting functionalities such as hydrophilicity/hydrophobicity, charge transport property, and adhesion.

In addition, the device of the present invention can form the positive hole injection transport layer by the solution applying method, therefore, layers from the positive hole injection transport layer to a light emitting layer can be sequentially formed on a substrate having a liquid-repellent bank only by an applying process. Therefore, the above applying process is more simple and has an advantage of producing the device at lower cost compared with a process as the case of the transition metal oxide being the inorganic compound, including after depositing the positive hole injection layer by a vapor deposition using a very fine mask or the like, forming the positive hole transport layer and the light emitting layer by the solution applying method, and further depositing a second electrode.

The formation of the charge transfer complex can be suggested by the phenomenon observed by the 1H NMR measurement, for example, in which the shape of proton signal and a chemical shift value derived from the aromatic ring observed around 6 to 10 ppm regarding a charge transport compound change after the transition metal-containing nanoparticle is mixed with a solution of the charge transport compound compared with those before the transition metal-containing nanoparticle is mixed with the solution of the charge transport compound.

Hereinafter, a constitution of layers of the device of the present invention will be described.

The device of the present invention comprises a substrate, two or more electrodes facing each other disposed on the substrate and a positive hole injection transport layer disposed between two electrodes among the two or more electrodes.

The device of the present invention includes organic devices such as an organic EL element, an organic transistor, a dye-sensitized solar battery, an organic thin film solar battery, and an organic semiconductor, and even includes a quantum dot light emitting element and an oxide compound solar battery having the positive hole injection transport layer.

FIG. 1 is a sectional schematic diagram showing a basic constitution of layers of the organic device of the present invention. The basic constitution of layers of the device of the present invention comprises two electrodes (1 and 6) facing each other disposed on a substrate 7, and an organic layer 3 containing at least a positive hole injection transport layer 2 disposed between the two electrodes (1 and 6).

The substrate 7 is a support medium for forming layers constituting the device. It is not required for the substrate 7 to be disposed on the surface of the electrode 1, and may be disposed on the outermost surface of the device.

The positive hole injection transport layer 2 is a layer containing at least the transition metal-containing nanoparticle and performing a function of injecting and/or transporting a positive hole from the electrode 1 to the organic layer 3.

The organic layer 3 is a layer which exhibits various functions depending on a type of the device by injecting and transporting the positive hole, and may comprise a single layer or two or more layers. In the case that the organic layer comprises two or more layers, the organic layer contains the positive hole injection transport layer, and further contains a layer which plays a central role in the function of the device (hereinafter, it will be referred to as a functional layer), and a layer which plays a supplementary role of the functional layer (hereinafter, it will be referred to as a supplementary layer). For example, in the case of the organic EL element, the positive hole transport layer further laminated on the surface of the positive hole injection transport layer corresponds to the supplementary layer, and the light emitting layer laminated on the surface of the positive hole transport layer corresponds to the functional layer.

The electrode 6 is disposed in a position where the organic layer 3 containing the positive hole injection transport layer 2 exists between the electrode 6 and the electrode 1 facing each other. In addition, if necessary, the device may have a third electrode, which is not shown in the figures. By applying an electric field to layers between the electrodes, the function of the device can be exhibited.

Figure 2:
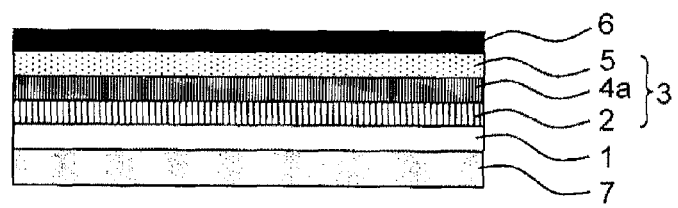
FIG. 2 is a schematic sectional view showing an example of a constitution of layers of the organic EL element being one embodiment of the device of the present invention.

FIG. 2 is a schematic sectional view showing an example of the constitution of layers of the organic EL element being one embodiment of the device of the present invention. The organic EL element of the present invention has an embodiment in which the positive hole injection transport layer 2 is laminated on the surface of the electrode 1, and the positive hole transport layer 4a and the light emitting layer 5 are laminated on the surface of the positive hole injection transport layer 2 as the supplementary layer and the functional layer respectively. In the case of using the positive hole injection transport layer characterized in the present invention at a position of the positive hole injection layer as above, the positive hole injection transport layer forms a charge transfer complex to be insoluble in the solvent used for the solution applying method in addition to improvement in electroconductivity, thus, it is possible to apply the solution applying method when the positive hole transport layer is laminated on the positive hole injection transport layer. Furthermore, the improvement in the adhesion to the electrode can be expected.

Figure 3:
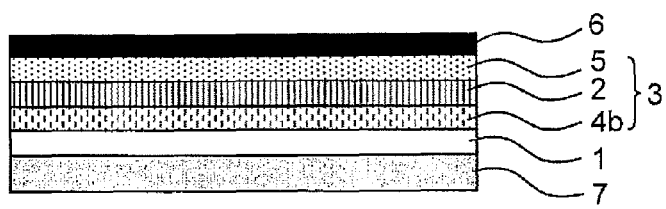
FIG. 3 is a schematic sectional view showing one of other examples of the constitution of layers of the organic EL element being one embodiment of the device of the present invention.

FIG. 3 is a schematic sectional view showing one of other examples of the constitution of layers of the organic EL element being one embodiment of the device of the present invention. The organic EL element of the present invention has an embodiment in which the positive hole injection layer 4b is formed on the surface of the electrode 1 as the supplementary layer, and the positive hole injection transport layer 2 and the light emitting layer 5 as the functional layer are laminated on the surface of the positive hole injection layer 4b. In the case of using the positive hole injection transport layer characterized in the present invention in a position of the positive hole injection layer as above, the positive hole injection transport layer forms the charge transfer complex to be insoluble in the solvent used for the solution applying method in addition to improvement in electroconductivity, thus, it is possible to apply the solution applying method when the light emitting layer is laminated on the positive hole injection transport layer.

Figure 4:
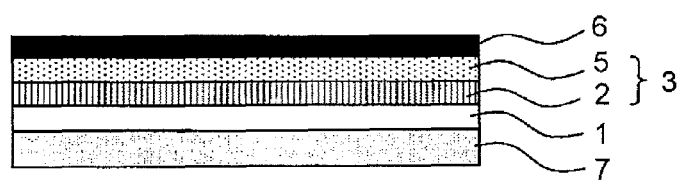
FIG. 4 is a schematic sectional view showing one of other examples of the constitution of layers of the organic EL element being one embodiment of the device of the present invention.

FIG. 4 is a schematic sectional view showing one of other examples of the constitution of layers of the organic EL element being one embodiment of the device of the present invention. The organic EL element of the present invention has an embodiment in which the positive hole injection transport layer 2 and the light emitting layer 5 as the functional layer are laminated in this order. In the case that the positive hole injection transport layer characterized in the present invention is used as a single layer as above, there is an advantage of reducing the number of steps in the process.

In FIGS. 2 to 4, each of the positive hole injection transport layer 2, the positive hole transport layer 4a, and the positive hole injection layer 4b may be constituted not by a single layer but by two or more layers.

In FIGS. 2 to 4, the electrode 1 functions as an anode and the electrode 6 functions as a cathode. The organic EL element has a function that, if the electric field is applied between the anode and cathode, the positive hole is injected from the anode to the light emitting layer 5 through the positive hole injection transport layer 2 and the positive hole transport layer 4, and the electron is injected from the cathode to the light emitting layer, thus, recombining of the injected positive hole and electron is performed in the light emitting layer 5 to emit light to the outside of the element.

In order to emit the light to the outside of the element, at least all layers on one surface of the light emitting layer are required to have permeability to the light of at least a part of wavelength in a visible wavelength range. In addition, if necessary, an electron transport layer and/or an electron injection layer may be disposed between the light emitting layer and the electrode 6 (cathode) (not shown in figures).

Figure 5:
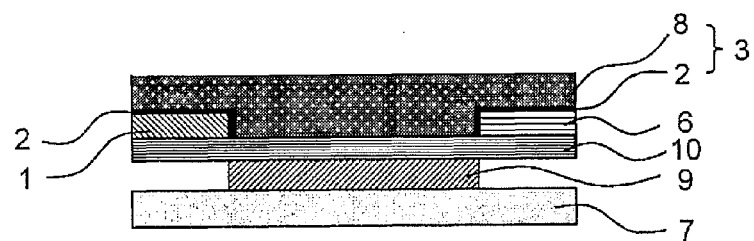
FIG. 5 is a schematic sectional view showing an example of a constitution of layers of the organic transistor being another embodiment of the device of the present invention.

FIG. 5 is a schematic sectional view showing an example of the constitution of layers of the organic transistor being another embodiment of the device of the present invention. The organic transistor comprises an electrode 9 (gate electrode), an electrode 1 (source electrode) and the electrode 6 (drain electrode) facing each other, an organic semiconductor layer 8 as the organic layer disposed between the electrode 9, the electrode 1 and the electrode 6, and an insulating layer 10 interposed between the electrode 9 and the electrode 1, and the electrode 9 and the electrode 6 on a substrate 7, and the positive hole injection transport layer 2 is formed on the surfaces of the electrode 1 and electrode 6.

The above organic transistor has a function of controlling currents between the source electrode and drain electrode by controlling the accumulation of the charges in the gate electrode.

Figure 6:
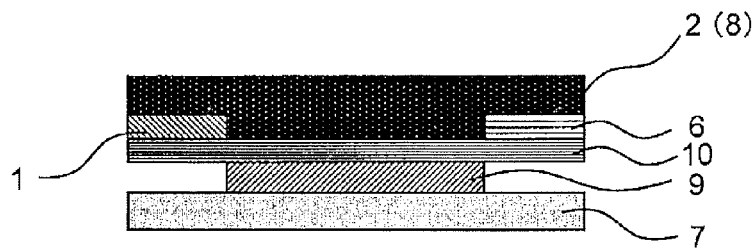
FIG. 6 is a schematic sectional view showing one of other examples of the constitution of layers of the organic transistor being another embodiment of the device of the present invention.

FIG. 6 is a schematic sectional view showing an example of another constitution of layers of the organic transistor being the embodiment of the device of the present invention. The organic transistor comprises an electrode 9 (gate electrode), an electrode 1 (source electrode) and an electrode 6 (drain electrode) facing each other, an organic semiconductor layer 8 consisting of the positive hole injection transport layer 2 of the present invention being formed as the organic layer disposed between the electrode 9, the electrode 1 and the electrode 6, and an insulating layer 10 interposed between the electrode 9 and the electrode 1, and the electrode 9 and the electrode 6 on a substrate 7. In this example, the positive hole injection transport layer 2 functions as the organic semiconductor layer 8.

The constitution of layers of the device of the present invention is not limited to the above examples, and one having a constitution substantially as same as the technical idea disclosed in claims of the present invention and providing similar function effects is included in the technical scope of the present invention.

Hereinafter, each layer of the device of the present invention will be described in detail.

(1) Positive Hole Injection Transport Layer

The device of the present invention contains at least the positive hole injection transport layer. In the case that the device of the present invention is an organic device and the organic layer comprises two or more layers, the organic layer contains the positive hole injection transport layer, and further contains a layer which plays a central role in the function of the device, and a supplementary layer which plays a supplementary role in supporting the functional layer. The functional layer and the supplementary layer will be described in detail in the specific example of the device that will be hereinafter described.

The positive hole injection transport layer of the device of the present invention contains at least a transition metal-containing nanoparticle. The positive hole injection transport layer of the device of the present invention may only comprise the transition metal-containing nanoparticle, but may further contain other components. In particular, it is preferable that the positive hole injection transport layer further contains the positive hole transport compound from the viewpoint of lowering driving voltage and further extending an element lifetime.

In the case that the positive hole injection transport layer of the device of the present invention further contains the positive hole transport compound, the positive hole injection transport layer of the device of the present invention may only comprise a mixed layer containing the transition metal-containing nanoparticle and the positive hole transport compound, or may comprise two or more layers including the mixed layer. In addition, the positive hole injection transport layer may comprise two or more layers in which a layer containing the transition metal-containing nanoparticle and a layer containing the positive hole transport compound are laminated. Furthermore, the positive hole injection transport layer may be a layer in which at least a layer containing the transition metal-containing nanoparticle and a layer containing at least the transition metal-containing nanoparticle and the positive hole transport compound are laminated.

The transition metal-containing nanoparticle used in the present invention contains at least the transition metal compound including the transition metal oxide, the transition metal and the protecting agent, or at least the transition metal compound including the transition metal oxide and the protecting agent. The transition metal-containing nanoparticle generally contains a particle containing at least the transition metal compound including the transition metal oxide and the transition metal or a particle containing at least the transition metal compound including the transition metal oxide, and the protecting agent which protects the surface of the particle. Unlike the particle formed by merely pulverizing the transition metal oxide as described in Patent Literature 8, the transition metal-containing nanoparticle of the present invention has significantly high dispersing stability of the nanoparticle, and can form a thin film having a nanometer order with high uniformity, since an organic compound is attached particularly on the surface of the particle as the protecting agent. The thin film has high temporal stability and uniformity, therefore, it is less likely to short out. Furthermore, the thin film has an excellent adhesion to an adjacent electrode or organic layer. Herein, the "nanoparticle" means a particle having a diameter of nm (nanometer) order, that is, a particle having a diameter of less than 1 µm.

The particle containing at least the transition metal compound including the transition metal oxide and the transition metal, or the particle containing at least the transition metal compound including the transition metal oxide may have a single structure or a composite structure, or may also have a core-shell structure, alloy structure or island structure. Examples of the transition metal compound contained in the transition metal-containing nanoparticle include oxides, sulfides, borides, selenides, halides and complexes. In the present invention, the transition metal-containing nanoparticle certainly contains the transition metal oxide. By certainly containing the transition metal oxide, a value of ionization potential can be optimized. Also, the change from the metal having an unstable oxidation number of +0 by oxidation can be previously prevented, thus, driving voltage can be lowered and the element lifetime can be extended. Particularly, it is preferable that the transition metal oxides having a different oxidation number are contained together in the transition metal-containing nanoparticle. By certainly containing the transition metal oxides having a different oxidation number together in the transition metal-containing nanoparticle, positive hole transport and positive hole injection properties can be reasonably controlled due to the balance of the oxidation number, thus, the driving voltage can be lowered and the element lifetime can be extended. Transition metal atoms and compounds such as an oxide and a boride having various valences may be contained together in the nanoparticle depending on treatment condition.

Specific examples of the transition metal or the transition metal contained in the transition metal compound contained in the transition metal-containing nanoparticle used in the present invention include molybdenum, tungsten, vanadium, rhenium, nickel, copper, titanium, platinum, and silver.

Among the above, the transition metal and the transition metal in the transition metal compound contained in the transition metal-containing nanoparticle are preferably at least a kind of metal selected from the group consisting of molybdenum, tungsten, vanadium, and rhenium from the viewpoint of easily forming the charge transfer complex due to high reactivity, thus lowering driving voltage and extending the element lifetime.

The amount of the transition metal oxide contained in the transition metal-containing nanoparticle used in the present invention is preferably 90 mol % or more, more preferably 95 mol % or more in the transition metal and transition metal compound, from the viewpoint of lowering driving voltage and extending the element lifetime.

The type of the protecting agent is appropriately selected, and is not particularly limited. The protecting agent preferably contains a linking group which functions to connect the transition metal and/or transition metal compound and an organic group having hydrophobicity from the viewpoint of the surface protection and the dispersing stability of the transition metal-containing particle. As the protecting agent, a structure having a hydrophilic group as the linking group in the end of the organic group having hydrophobicity can be exemplified. The protecting agent may be a low molecular weight compound or a polymer compound.

The linking group is not particularly limited as long as it has a function to connect the transition metal and/or transition metal compound. The type of the linking includes adsorption and coordination, and a chemical bond such as an ion bond or a covalent bond is preferable. The number of the linking group in the protecting agent may be any number as long as one or more linking groups are contained in one molecule. In the case that the transition metal-containing nanoparticle is dispersed in the positive hole transport compound that will be described hereinafter, if two or more linking groups are contained in one molecule of the protecting agent, the protecting agents are polymerized so that the linking group, which has poor compatibility with the positive hole transport compound that will be described hereinafter, is exposed on the positive hole transport compound side being a binder component, thus, the compatibility between the positive hole transport compound and the transition metal-containing nanoparticle may be interrupted. Therefore, in such a case, one linking group is preferably contained in one molecule of the protecting agent. In the case that the number of the linking group is one in one molecule, the protecting agent is bound to a particle or forms a dimer by a bimolecular reaction, then the reaction terminates. The dimer has a poor adhesion to the particle, therefore, it can be easily removed from a film if a washing process is provided.

Examples of the linking group include hydrophilic groups such as a carboxyl group, an amino group, a hydroxyl group, a thiol group, an aldehyde group, a sulfonic acid group, an amide group, a sulfonamide group, a phosphoric acid group, a phosphinic acid group and a P=O group. The linking group is preferably one or more groups selected from the functional groups represented by the following formulae (1a) to (1l):

[Chemical formula 2]

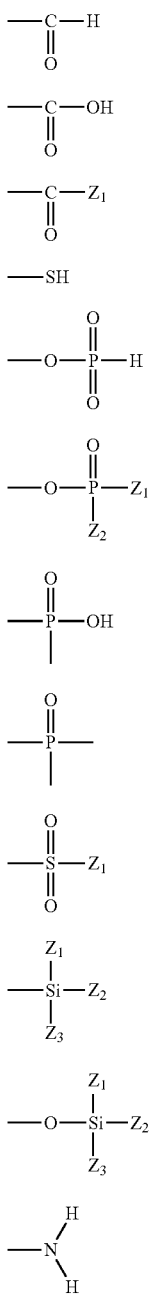

Examples of the organic group contained in the protecting agent include a linear or branched and saturated or unsaturated alkyl group having 4 or more carbon atoms, preferably having 6 to 30 carbon atoms, and more preferably having 8 to 20 carbon atoms, and an aromatic hydrocarbon and/or heterocyclic ring. Particularly, the protecting agent preferably contains the linking group, which functions to connect the transition metal and/or transition metal compound, and the aromatic hydrocarbon and/or heterocyclic ring from the viewpoint of improving the dispersing stability of the film and contributing to the achievement of a long driving lifetime due to the improvement of the compatibility with the positive hole transport compound and the adhesion to the adjacent organic layer.

Specific examples of the aromatic hydrocarbon and/or heterocyclic ring include benzene, triphenylamine, fluorene, biphenyl, pyrene, anthracene, carbazole, phenylpyridine, trithiophene, phenyloxadiazole, phenyltriazole, benzimidazole, phenyltriazine, benzodiathiazine, phenylquinoxaline, phenylenevinylene, phenylsilole, and a combination of the above structures.

Unless the effect of the present invention is interfered, the structure containing the aromatic hydrocarbon and/or heterocyclic ring may contain a substituent. Examples of the substituent include a linear or branched alkyl group having 1 to 20 carbon atoms, a halogen atom, an alkoxy group having 1 to 20 carbon atoms, a cyano group, and a nitro group. In the linear or branched alkyl group having 1 to 20 carbon atoms, a linear or branched alkyl group having 1 to 12 carbon atoms, for example, a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, etc. is preferable.

It is preferable that the protecting agent has a charge transport group from the viewpoint of contributing to the achievement of the long driving lifetime due to the improvement of the compatibility with the positive hole transport compound and the charge transport property. The charge transport group is a group which exhibits the property of having drift mobility of an electron or a positive hole due to its chemical structure group, or is defined as a group which can obtain detection current due to charge transport by a known method which can detect charge transport performance such as a Time-Of-Flight method. In the case that the charge transport group cannot exist by itself, a compound in which a hydrogen atom is added to the charge transport group may be a charge transport compound. As the charge transport group, a residue excluding a hydrogen atom in the positive hole transport compound (an arylamine derivative, a carbazole derivative, a thiophene derivative, a fluorene derivative, and a distyryl benzene derivative) that will be described hereinafter can be exemplified.

In the transition metal-containing nanoparticle used in the present invention, the content ratio of the transition metal compound, the transition metal and the protecting agent is appropriately selected, and is not particularly limited. The amount of the protecting agent is preferably from 10 to 20 parts by weight with respect to 100 parts by weight of the transition metal compound and the transition metal.

The average particle diameter of the transition metal-containing nanoparticle used in the present invention is not particularly limited, and is, for example, in the range from 0.5 to 999 nm, preferably in the range from 0.5 to 50 nm, more preferably in the range from 0.5 to 20 nm. The average particle diameter of the transition metal-containing nanoparticle used in the present invention is further preferably 15 nm or less, and particularly preferably in the range from 1 to 10 nm. The reason thereof is assumed that if the particle diameter of the transition metal-containing nanoparticle is too small, it is difficult to be produced, and to the contrary, if the particle diameter is too large, the surface area (specific surface area) per unit weight decreases, thus, a desired effect may not be obtained, and further, it is likely to short out since the surface roughness of the film increases.

Herein, the average particle diameter means a number average particle size measured by a dynamic light scattering method. In the state that the transition metal-containing nanoparticles are dispersed in the positive hole injection transport layer, the average particle diameter is a value obtained by selecting a region where the presence of 20 or more transition metal-containing nanoparticles can be confirmed from an image obtained by means of a scanning electron microscope (SEM) or a transmission electron microscope (TEM), and measuring the particle diameters of all transition metal-containing nanoparticles in the region to calculate a mean value.

The positive hole injection transport layer of the present invention may comprise two or more kinds of the transition metal-containing nanoparticles which have different kinds of the transition metal respectively. In the case of using two or more kinds of single metal-containing nanoparticles containing single metal as the transition metal, or the transition metal in the transition metal compound, there is an advantage that a positive hole injection transport layer which supplements positive hole transport property and positive hole injection property each other, and has also other functions such as photocatalytic property, etc. can be formed.

The method for producing the transition metal-containing nanoparticle used in the present invention is not particularly limited as long as it is a method able to obtain the transition metal-containing nanoparticle described above. For example, a liquid phase method in which a transition metal complex and the protecting agent are reacted in an organic solvent can be exemplified.

On the other hand, as the positive hole transport compound used in the present invention, a compound having positive hole transport property can be appropriately used. The positive hole transport property as used herein means that overcurrent by positive hole transport is observed by a known photocurrent method.

As the positive hole transport compound, a polymer compound is suitably used besides a low molecular weight compound. A positive hole transport polymer compound means a polymer compound having the positive hole transport property and a weight-average molecular weight of 2,000 or more in terms of polystyrene by gel permeation chromatography. In the positive hole injection transport layer of the present invention, as a positive hole transport material, it is preferable to use a polymer compound easily soluble in the organic solvent and capable of forming a stable coating film in which compounds hardly aggregate, in order to form a stable film by the solution applying method.

The positive hole transport compound is not particularly limited, and the examples include arylamine derivatives, anthracene derivatives, carbazole derivatives, thiophene derivatives, fluorene derivatives, distyryl benzene derivatives, and Spiro compounds. Specific examples of the arylamine derivatives include N,N'-bis-(3-methylphenyl)-N,N'-bis-(phenyl)-benzidine (TPD), bis(N-(1-naphthyl-N-phenyl)benzidine) (α-NPD), 4,4',4''-tris(3-methylphenylphenylamino)triphenylamine (MTDATA), and 4,4',4''-tris(N-(2-naphthyl)-N-phenylamino)triphenylamine (2-TNATA). Specific examples of the carbazole derivatives include 4,4-N,N'-dicarbazole-biphenyl (CBP), etc. Specific examples of the fluorene derivatives include N,N'-bis(3-methylphenyl)-N,N'-bis(phenyl)-9,9-dimethylfluorene (DMFL-TPD), etc. Specific examples of the distyryl benzene derivatives include 4-(di-p-tolylamino)-4'-[(di-p-tolylamino)styryl]stilbene (DPAVB), etc. Specific examples of the Spiro compounds include 2,7-bis(N-naphthalene-1-yl-N-phenylamino)-9,9-spirobifluorene (Spiro-NPB), and 2,2',7,7'-tetrakis(N,N-diphenylamino)-9,9'-spirobifluorene (Spiro-TAD).

In addition, as the positive hole transport polymer compound, a polymer containing an arylamine derivative, an anthracene derivative, a carbazole derivative, a thiophene derivative, a fluorene derivative, a distyryl benzene derivative, or a Spiro compound in a repeating unit can be exemplified.

Specific examples of the polymers containing the arylamine derivative in the repeating unit include non-conjugated polymers such as copoly[3,3'-hydroxy-tetraphenylbenzidine/diethylene glycol]carbonate (PC-TPD-DEG), PTPDES and Et-PTPDEK represented by the structures described below, and conjugated polymers such as poly[N,N'-bis(4-butylphenyl)-N,N'-bis(phenyl)-benzidine]. Specific examples of the polymers containing the anthracene derivative in the repeating unit include poly[(9,9-dioctylfluorenyl-2,7-diyl)-co-(9,10-anthracene)], etc. Specific examples of the polymers containing the carbazole in the repeating unit include polyvinylcarbazole (PVK), etc. Specific examples of the polymers containing the thiophene derivative in the repeating unit include poly[(9,9-dioctylfluorenyl-2,7-diyl)-co-(bithiophene)], etc. Specific examples of the polymers containing the fluorene derivative in the repeating unit include poly[(9,9-dioctylfluorenyl-2,7-diyl)-co-(4,4'-(N-(4-sec-butylphenyl))diphenylamine)] (TFB), etc. Specific examples of the polymers containing the Spiro compound in the repeating unit include poly[(9,9-dioctylfluorenyl-2,7-diyl)-alt-co-(9,9'-spiro-bifluorene-2,7-diyl)], etc. These positive hole transport polymer compounds may be used alone or in combination of two or more kinds.

[Chemical formula 3]

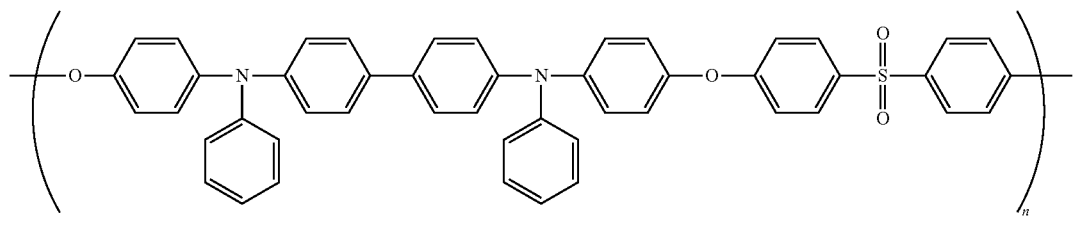

PTPDES

-continued

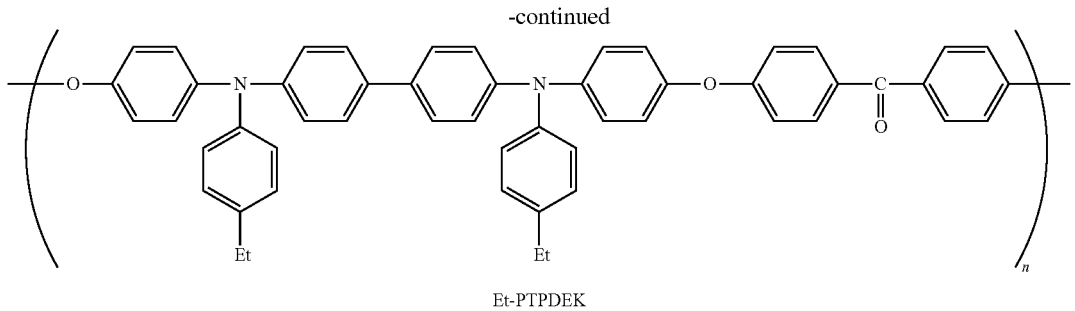

Et-PTPDEK

Among the above, it is preferable that the positive hole transport polymer compound is a compound represented by the following formula (2) from the viewpoint of obtaining good adhesion stability to the adjacent organic layer and having the HOMO energy value between an anode substrate and a light emitting layer material.

[Chemical formula 4]

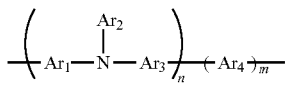

(2)

wherein $Ar_1$ to $Ar_4$ may be the same or different from each other; each of $Ar_1$ to $Ar_4$ represents an unsubstituted or substituted aromatic hydrocarbon group comprising 6 or more and 60 or less carbon atoms relating to a conjugated bond, or an unsubstituted or substituted heterocyclic group comprising 4 or more and 60 or less carbon atoms relating to the conjugated bond; "n" is 0 to 10,000; "m" is 0 to 10,000; "n+m" is 10 to 20,000; and the arrangement of two repeating units is arbitrarily selected.

The arrangement of two repeating units is arbitrarily selected. For example, it may be any of a random copolymer, alternative copolymer, periodic copolymer and block copolymer.

The average of "n" is preferably from 5 to 5,000, more preferably from 10 to 3,000. The average of "m" is preferably from 5 to 5,000, more preferably from 10 to 3,000. In addition, the average of "n+m" is preferably from 10 to 10,000, more preferably from 20 to 6,000.

In $Ar_1$ to $Ar_4$ of the above formula (2), specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof.

In the case that $Ar_1$ to $Ar_4$ of the above formula (2) contain a substituent, the substituent is preferably a linear or branched alkyl group or alkenyl group having 1 to 12 carbon atoms, such as a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, an undecyl group, a dodecyl group, a vinyl group, and an allyl group.

Preferable specific examples of the compound represented by the above formula (2) include poly[(9,9-dioctylfluorenyl-2,7-diyl)-co-(4,4'-(N-(4-sec-butylphenyl)) diphenylamine)] (TFB) represented by the following formula (4), poly[(9,9-dioctylfluorenyl-2,7-diyl)-alt-co-(N,N'-bis{4-butylphenyl}-benzidine N,N'-{1,4-diphenylene})] represented by the following formula (5), and poly[(9,9-dioctylfluorenyl-2,7-diyl)] (PFO) represented by the following formula (6).

[Chemical formula 5]

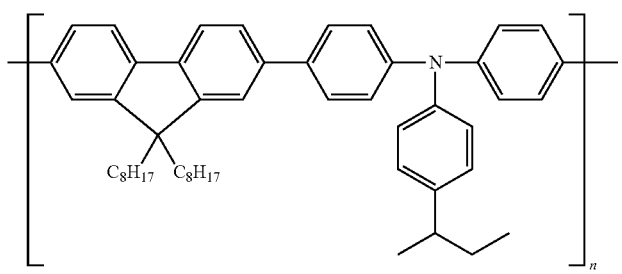

(4)

[Chemical formula 6]

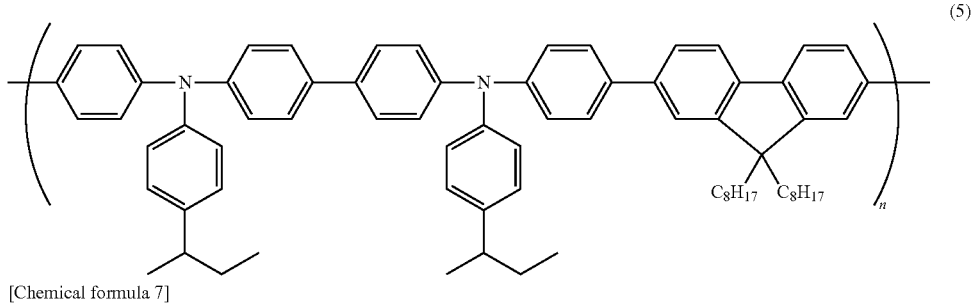

(5)

[Chemical formula 7]

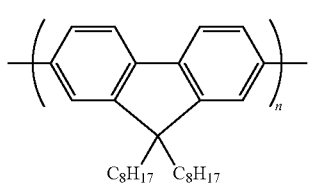

(6)

In the case of using the positive hole transport compound in the positive hole injection transport layer of the present invention, it is preferable that the positive hole transport compound has a moiety A having a sum atomic weight MA of 100 or more,
wherein the protecting agent in the transition metal-containing nanoparticle has, besides the linking group, a moiety B having a sum atomic weight MB of 100 or more, the sum atomic weight MB and the sum atomic weight MA satisfy a relationship of the following formula (I):

$|MA-MB|/MB \leq 2$, and the sum atomic weight MB is larger than one third of a molecular weight of the protecting agent, and
wherein a solubility parameter SA of the moiety A and a solubility parameter SB of the moiety B satisfy a relationship of the following formula (II):

$|SA-SB| \leq 2$

Since the moiety A of the positive hole transport compound and the moiety B of the protecting agent in the transition metal-containing nanoparticle satisfy the relationship of the above formulae (I) and (II), matching of molecular polarity between the moiety A and the moiety B becomes excellent, and the compatibility and adhesion between the positive hole transport compound and transition metal-containing nanoparticle which are contained in the same layer or adjacent layers improve. Thereby, the dispersing stability of the transition metal-containing nanoparticle improves and the aggregation and phase separation of the transition metal-containing nanoparticles upon forming a film or upon long driving of a light emitting device can be prevented, therefore, an electronic device having a long driving lifetime can be obtained.

In this case, in the positive hole transport compound, the sum atomic weight MA is preferably 150 or more, more preferably 200 or more. In the case that two or more moieties A are contained in one molecule of the positive hole transport compound, for example, the positive hole transport compound is a polymer compound having a repeating unit, the sum atomic weight of the atoms contained in two or more moieties A is preferably larger than one third of a molecular weight of the positive hole transport compound having the moieties A from the view point of further improving the compatibility between the positive hole transport compound and the transition metal-containing nanoparticle, and is more preferably two-fifths or more, still more preferably three-fifths or more of the molecular weight of the positive hole transport compound having the moiety A.

On the other hand, the sum atomic weight MB of the atoms contained in the moiety B of the protecting agent in the transition metal-containing nanoparticle is preferably 150 or more, more preferably two-fifths or more, still more preferably three-fifths or more, of the molecular weight of the protecting agent.

In addition, in order to satisfy the above formula (I), it is preferable to use a material having a small difference between MA and MB. The smaller difference between MA and MB is, the more preferable it is. The value of $|MA-MB|/MB$ is preferably 1 or less, more preferably 0.5 or less.

In the above formula (II), the difference between SA and SB is preferably 1 or less, more preferably 0.5 or less.

Herein, the solubility parameter (hereinafter, it may be referred to as a SP value) means an indicator of the compatibility and incompatibility between substances, and is related to the polarity of the groups in the molecule. When the difference in the SP value between the two substances in contact with each other is small, the difference in the polarity of two molecules is also small. In this case, the cohesion force between two substances is close to each other. Therefore, the compatibility and solubility are so large that the substances are easily soluble, and can realize the adhesion stability of an interface, that is, the stable contact surface. On the other hand, when the difference in the SP value is large, the difference in the cohesion force between two substances is also large. In this case, the compatibility and solubility are so low that the substances become hardly-soluble or insoluble, thus, the dispersibility of the two substances is unstable, therefore, the interface changes so as to reduce a contact area between two substances.

There are some measuring methods and calculating methods of the SP value. In the present invention, the SP value is determined by a method of Bicerrano [Prediction of polymer properties, Marcel Dekker Inc., New York (1993)]. In the method of Bicerrano, the solubility parameter of a polymer is determined by the Atomic Group Contribution Method.

If the solubility parameter cannot be determined by the method of Bicerrano described above, methods disclosed in other known documents such as Fedors [Fedors, R. F., Polymer Eng. Sci., 14, 147 (1974)] and Askadskii [A. A. Askadaskii et al., Vysokomol. Soyed., A19, 1004 (1977).] can be used. In the method of Fedors, the solubility parameter of a polymer is determined by the Atomic Group Contribution Method. The Atomic Group Contribution Method is a method for determining the properties of entire molecule by dividing a molecule into some atomic groups, and allocating experimental parameters to each atomic group.

A solubility parameter δ of a molecule is defined by the following formula:

$$\delta = (\delta_d^2 + \delta_p^2 + \delta_h^2)^{1/2}$$

Herein, $\delta_d$ is a London dispersion force term, $\delta_p$ is a molecular polarization term, and $\delta_h$ is a hydrogen bond term. Each term is calculated by the following formula using each molar attraction constant ($F_di$, $F_pi$, $E_hi$) and molar volume "Vi" of a constituent atomic group "i" in the molecule.

$$\delta_d^2 = \Sigma F_d i / \Sigma Vi$$

$$\delta_p^2 = (\Sigma F_p i^2)^{1/2} / \Sigma Vi$$

$$\delta_h^2 = (\Sigma E_h i / \Sigma Vi)^{1/2}$$

As for each molar attraction constant ($F_di$, $F_pi$, $E_hi$) and molar volume "Vi" of the constituent atomic group "i", numerical values described in the calculating table of a three-dimensional solubility parameter shown in Table 1 are used. As for the atomic groups not described in Table 1, the values obtained by van Krevelen (Documents A and B described below) are used for the molar attraction constant ($F_di$, $F_pi$, $E_hi$) of each term, and the values obtained by Fedors (Document C) are used for the molar volume "Vi".

TABLE 1

| Structural Group | Fdi | Fpi | Ehi | Vi |
|---|---|---|---|---|
| —CH3 | 420 | 0 | 0 | 31.7 |
| —CH2— | 270 | 0 | 0 | 16.1 |
| >CH— | 80 | 0 | 0 | −1.0 |
| >C< | −70 | 0 | 0 | −19.2 |
| =CH2 | 403 | 94 | 143 | 28.5 |
| =CH— | 223 | 70 | 143 | 13.5 |
| =C< | 70 | 0 | 0 | −5.5 |
| —C6H11 | 1620 | 0 | 0 | 95.5 |
| —C6H5 | 1499 | 110 | 205 | 75.4 |
| —C6H4(o, m, p) | 1319 | 110 | 205 | 60.4 |
| —F | 221 | 542 | — | 18.0 |
| —F (disubstitution, >CF2) | 221 | 542 | — | 20.0 |
| —F (trisubstitution, —CF3) | 221 | 542 | — | 22.0 |
| —Cl | 450 | 550 | 400 | 24.0 |
| —Cl (disubstitution, >CCl2) | 450 | 550 | 400 | 26.0 |
| —Cl (trisubstitution, —CCl3) | 450 | 550 | 400 | 27.3 |
| —Br | 550 | 614 | 1023 | 29.0 |
| —Br (disubstitution, >CBr2) | 550 | 614 | 1023 | 31.0 |
| —Br (trisubstitution, —CBr3) | 550 | 614 | 1023 | 32.0 |
| —I | 655 | 655 | 2046 | 32.2 |
| —CN | 430 | 1100 | 2500 | 24.0 |
| —OH | 210 | 500 | 20000 | 10.0 |
| —OH (disubstitution or on adjacent carbon) | 210 | 500 | 20000 | 13.0 |
| —O— | 235 | 409 | 2352 | 3.8 |
| —COH(aldehyde) | 470 | 800 | 4500 | 22.3 |
| >C=O | 290 | 770 | 2000 | 10.5 |
| —COOH | 530 | 420 | 10000 | 28.5 |
| —COO-(ester) | 390 | 490 | 7000 | 18.0 |
| HCOO-(formate) | 530 | — | — | 32.5 |
| —CO—O—CO-(anhydride) | 675 | 1105 | 4838 | 30.0 |
| —NH2 | 280 | 419 | 8400 | 17.9 |
| —NH— | 160 | 210 | 3100 | 4.5 |

TABLE 1-continued

| Structural Group | Fdi | Fpi | Ehi | Vi |
|---|---|---|---|---|
| >N— | 20 | 800 | 5000 | −9.0 |
| —NO2(aliphatic) | 500 | 1070 | 1500 | 24.0 |
| —NO2(aromatic) | 500 | 1070 | 1500 | 32.0 |
| >Si—O— | 266 | 307 | 921 | 3.8 |
| —S-(sulifude) | 440 | — | — | 12.0 |
| =PO4-(phosphate) | 740 | 1893 | 6352 | 28.0 |
| Ring (more than five-membered ring) | 190 | — | — | 13.5 |
| Ring (more than three, four-membered ring) | 190 | — | — | 18.0 |

Document A: K.E. Meusburger: "Pesticide Formulations: Innovations and Developments" Chapter 14 (Am. Chem. Soc.), 151 to 162 (1988)
Document B: A. F. M. Barton: "Handbook of Solubility Parameters and Other Cohesion Parameters" (CRC Press Inc., Boca Raton, FL) (1983)
Document C: R. F. Fedors: Polymer Eng. Sci., 14, (2), 147 to 154 (1974)

As an experimental evaluation method for evaluating the aggregation stability of a mixed thin film, a method comprising the steps of heating the thin film, and observing a morphological change on the surface thereof can be exemplified. However, this method is affected by the matching of the SP value with a substrate or an air interface, and involves the difficulties of quantification. Therefore, as the method for evaluating the stability of the mixed thin film, the method by the above calculation is preferable.

In the case of considering the above formulae (I) and (II), it is preferable that the moiety A of the positive hole transport compound has the same skeleton as that of the moiety B of the protecting agent in the transition metal-containing nanoparticle, or a similar skeleton containing a spacer structure in the same skeleton from the view point of improving the compatibility between the positive hole transport compound and the transition metal-containing nanoparticle due to decrease in difference between SA and SB represented by the above formula (II), improving the dispersing stability of the transition metal-containing nanoparticle protected by the protecting agent, and improving the adhesion to an adjacent layer, thus, contributing to an achievement of a long driving lifetime.

The skeleton means a structure of the moiety A or moiety B excluding substituents. Herein, "contain a spacer structure" means that an atom which elongates a skeleton is contained. The atom which elongates the skeleton is preferably a hydrocarbon structure having 1 to 12 carbon atoms, and also other atoms such as an ether bond, etc. may be included.

Specific examples of the skeleton in which the moiety A and moiety B commonly have include a triphenylamine skeleton, a fluorene skeleton, a biphenyl skeleton, a pyrene skeleton, an anthracene skeleton, a carbazole skeleton, a phenylpyridine skeleton, a trithiophene skeleton, a phenyloxadiazole skeleton, a phenyltriazole skeleton, a benzimidazole skeleton, a phenyltriazine skeleton, a benzodiathiazine skeleton, a phenylquinoxaline skeleton, a phenylenevinylene skeleton, a phenylsilole skeleton, and a skeleton in which the above skeletons are used in combination.

The moiety A and moiety B may have different type, number, and position of the substituent on the skeleton as long as the skeleton of the moiety A and moiety B is the same or similar. As the substituent on the skeleton, the substituent described in the protecting agent in the nanoparticle can be exemplified.

Two or more kinds of the moiety A of the positive hole transport compound and the moiety B of the protecting agent in the transition metal-containing nanoparticle may be present in one molecule respectively. In this case, a ratio of common moiety in total parts is large, that is, the difference between SA and SB represented by the above formula (II) is small, thus, the compatibility between the positive hole transport compound and the transition metal-containing nanoparticle improves.

In the case of using a polymer compound having one or two or more kinds of repeating units as the positive hole transport compound, generally, one or two or more kinds of repeating units are selected from the repeating units to assign the moiety A, and a protecting agent containing the moiety B having the same skeleton as that of the moiety A, or a similar skeleton containing a spacer structure in the same skeleton is used as the protecting agent in the transition metal-containing nanoparticle.

When the positive hole transport compound is a compound represented by the above chemical formula (2), a compound represented by the following chemical formula (3) is preferably used as the protecting agent in the transition metal-containing nanoparticle.

[Chemical formula 8]

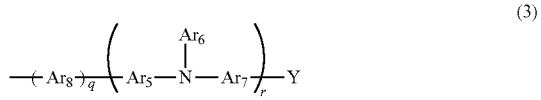

(3)

wherein $Ar_5$ to $Ar_8$ may be the same or different from each other; each of $Ar_5$ to $Ar_8$ represents an unsubstituted or substituted aromatic hydrocarbon group comprising 6 or more and 60 or less carbon atoms relating to a conjugated bond, or an unsubstituted or substituted heterocyclic group comprising 4 or more and 60 or less carbon atoms relating to the conjugated bond; "q" is 0 to 10; "r" is 0 to 10; "q+r" is 1 to 20; the arrangement of two repeating units is arbitrarily selected; and Y represents a linking group.

In $Ar_5$ to $Ar_8$, specific examples of an aromatic hydrocarbon in the aromatic hydrocarbon group include benzene, fluorene, naphthalene, anthracene, a combination thereof, derivatives thereof, phenylenevinylene derivatives, and styryl derivatives. In addition, specific examples of a heterocyclic ring in the heterocyclic group include thiophene, pyridine, pyrrole, carbazole, a combination thereof, and derivatives thereof. $Ar_5$ to $Ar_8$ may have a substituent similar to the substituent of $Ar_1$ to $Ar_4$ of the above formula (2).

It is preferable that at least the skeleton of the aromatic hydrocarbon group or heterocyclic group of the combination of $Ar_1$, $Ar_6$, and $Ar_7$ and/or $Ar_8$ i in Formula (3) is the same as that of the combination of $Ar_1$, $Ar_2$, and $Ar_3$ and/or any of $Ar_1$ $Ar_2$, $Ar_3$ or $Ar_4$ in Formula (2).

In the case of using the positive hole transport compound in the positive hole injection transport layer of the present invention, the content of the positive hole transport compound is preferably from 10 to 10,000 parts by weight with respect to 100 parts by weight of the transition metal-containing nanoparticle from the viewpoint of improving the positive hole injection transport property and achieving a long lifetime due to high stability of a film.

If the content of the positive hole transport compound in the positive hole injection transport layer is too low, it may be difficult to obtain the synergistic effect of having the positive hole transport compound mixed. On the other hand, if the content of the positive hole transport compound is too high, it becomes difficult to obtain the effect of using the transition metal-containing nanoparticle.

Unless the effect of the present invention is interfered, the positive hole injection transport layer of the present invention may contain an additive such as a binder resin, a curable resin or a coating property improver. Examples of the binder resin include a polycarbonate, a polystyrene, a polyarylate, and a polyester, and a binder resin which can be cured by heat or light may be contained. As the material which can be cured by heat or light, the positive hole transport compound having a curable functional group in the molecule or a curable resin can be used. Specific examples of the curable functional group include acrylic functional groups such as an acryloyl group and a methacryloyl group; a vinylene group; an epoxy group; and an isocyanate group. The curable resin may be a thermosetting resin or photocurable resin, and the examples include an epoxy resin, a phenol resin, a melamine resin, a polyester resin, a polyurethane resin, a silicon resin, and a silane coupling agent.

The film thickness of the positive hole injection transport layer can be appropriately determined according to the purpose or an adjacent layer thereof, and is generally from 0.1 to 1,000 nm, preferably from 1 to 500 nm.

In addition, the work function of the positive hole injection transport layer is preferably from 5.0 to 6.0 eV, more preferably from 5.0 to 5.8 eV, from the viewpoint of positive hole injection efficiency.

The positive hole injection transport layer of the present invention can be formed by the solution applying method. It is preferable that the positive hole injection transport layer of the present invention is formed by the solution applying method from the viewpoint of easy production process and high yield since it is less likely to short out, and achieving a long lifetime due to formation of a charge transfer complex. In this case, the positive hole injection transport layer of the present invention is formed by the solution applying method using a solution (ink for forming a positive hole injection transport layer) in which the transition metal-containing nanoparticle is dispersed in a solvent which can suitably disperse at least the transition metal-containing nanoparticle. In addition, in the case of forming the positive hole injection transport layer further containing the positive hole transport compound, it is formed by the solution applying method using a solution in which the transition metal-containing nanoparticle and the positive hole transport compound are mixed in a solvent which suitably dissolves or disperses both the above nanoparticle and compound. In this case, if the transition metal-containing nanoparticle and the positive hole transport compound are mixed in the solvent in which both the nanoparticle and the positive hole transport compound are suitably dissolved or dispersed, the transition metal-containing nanoparticle and the positive hole transport compound interacts each other and the charge transfer complex is easily formed, thus, the positive hole injection transport layer having an excellent positive hole transport property and temporal stability of a film can be formed. As described above, the positive hole injection transport layer which forms the charge transfer complex tends to be insoluble in the solvent used when the positive hole injection transport layer is formed, therefore, even in the case of forming the organic layer which corresponds to the layer on the positive hole injection transport layer, a possibility of using the solution applying method can be expanded without eluting the positive hole injection transport layer.

The solution applying method will be described in "Method for producing device" described hereinafter.

(2) Substrate

The substrate is a support medium of the device of the present invention. The material of the substrate may be, for example, a flexible material or a hard material. Examples of the material which can be specifically used include a glass, a quartz, a polyethylene, a polypropylene, a polyethylene terephthalate, a polymethacrylate, a polymethylmethacrylate, a polymethylacrylate, a polyester, and a polycarbonate.

Among the above, in the case of using a substrate made of a synthetic resin, it preferably has gas barrier property. The thickness of the substrate is not particularly limited, and is generally from around 0.5 to 2.0 mm.

(3) Electrode

The device of the present invention comprises the substrate, and two or more electrodes facing each other disposed on the substrate.

In the device of the present invention, the electrode is preferably formed of a metal or a metal oxide, and a known material can be appropriately employed. Generally, the electrode can be formed of a metal such as aluminum, gold, silver, nickel, palladium or platinum, or a metal oxide such as an oxide of indium and/or tin, etc.

Generally, there are many cases that the electrode is formed on the substrate by a method such as a sputtering method or a vacuum vapor deposition method, however, it can be formed by a wet process such as a coating method or a dip method. The thickness of the electrode varies depending on transparency or the like required for each electrode. If the transparency is required, the light transmittance in a visible light wavelength region of the electrode is generally 60% or more, preferably 80% or more. In this case, the thickness of the electrode is generally from about 10 to 1,000 nm, preferably from about 20 to 500 nm.

In the present invention, the device may further comprise a metal layer on the electrode to improve the adhesion stability to a charge injection material. The metal layer means a layer containing a metal, and is formed of the metal or the metal oxide generally used for the electrode described above.

(4) Others

The device of the present invention may comprise a known electron injection layer and/or electron transport layer, if necessary, between an electron injection electrode and an organic layer.

2. Organic EL Element

As an embodiment of the device of the present invention, an organic EL element comprising the organic layer containing at least the positive hole injection transport layer of the present invention and the light emitting layer can be exemplified.

Hereinafter, layers which constitute the organic EL element will be described in order using FIGS. 2 to 4.

(Substrate)

The substrate 7 is a support medium of the organic EL element. The material of the substrate may be, for example, a flexible material or a hard material. Specifically, for example, one described in "Substrate" for the device can be used.

If light emitted at the light emitting layer 5 transmits the substrate 7 side and is taken therefrom, at least the substrate 7 is required to be a transparent material.

(Anode and Cathode)

Either the electrode 1 or the electrode 6 is required to have transparency depending on the direction that light emitted at the light emitting layer 5 is taken. The electrode 1 needs to be formed of a transparent material if light emitted from the light emitting layer 5 is taken from the substrate 7 side, and the electrode 6 needs to be formed of a transparent material if light emitted from the light emitting layer 5 is taken from the electrode 6 side.

The electrode 1 disposed on the light emitting layer side of the substrate 7 functions as an anode which injects a positive hole to the light emitting layer, and the electrode 6 disposed on the light emitting layer side of the substrate 7 functions as a cathode which injects an electron to the light emitting layer 5.

In the present invention, it is preferable that the anode and cathode are formed of the metal or metal oxide described in "Electrode" for the device described above.

(Positive Hole Injection Transport Layer, Positive Hole Transport Layer, and Positive Hole Injection Layer)

As shown in FIGS. 2 to 4, the positive hole injection transport layer 2, the positive hole transport layer 4a, and the positive hole injection layer 4b are appropriately formed between the light emitting layer 5 and the electrode 1 (anode). As shown in FIG. 2, the positive hole transport layer 4a is further laminated on the positive hole injection transport layer 2 of the present invention, and the light emitting layer may be laminated thereon. As shown in FIG. 3, the positive hole injection transport layer 2 of the present invention is further laminated on the positive hole injection layer 4b, and the light emitting layer may be laminated thereon. As shown in FIG. 4, the positive hole injection transport layer 2 of the present invention is laminated on the electrode 1, and the light emitting layer is laminated thereon.

As shown in FIG. 2, in the case that the positive hole transport layer 4a is further laminated on the positive hole injection transport layer 2 of the present invention, a positive hole transport material used for the positive hole transport layer 4a is not particularly limited, and the positive hole transport compound described in "Positive hole injection transport layer" of the present invention is preferably used. Among the above, it is preferable to use a compound similar to the positive hole transport compound used for the adjacent positive hole injection transport layer 2 of the present invention from the viewpoint of improving the adhesion stability of the interface between the positive hole injection transport layer and the positive hole transport layer, and contributing to the achievement of a long driving lifetime.

The positive hole transport layer 4a can be formed of the positive hole transport material by a method similar to that of the light emitting layer that will be described hereinafter. The thickness of the positive hole transport layer 4a is generally from 0.1 to 1 μm, preferably from 1 to 500 nm.

As shown in FIG. 3, in the case that the positive hole injection transport layer 2 of the present invention is further laminated on the positive hole injection layer 4b, a positive hole injection material used for the positive hole injection layer 4b is not particularly limited, and a known compound can be used. Examples of the compound include phenylamines; starburst-type amines; phthalocyanines; oxides such as a vanadium oxide, a molybdenum oxide, a ruthenium oxide and an aluminum oxide; amorphous carbon; and derivatives of polyaniline and polythiophene.

The positive hole injection layer 4b can be formed of the positive hole injection material by a method similar to that of the light emitting layer that will be described hereinafter. The thickness of the positive hole injection layer 4b is generally from 1 nm to 1 μm, preferably from 2 to 500 nm, more preferably from 5 to 200 nm.

Furthermore, considering positive hole injection property, it is preferable that the positive hole injection material and positive hole transport material may be selected so as to make the value of work function (HOMO) of each layer larger in a stepwise fashion from the electrode 1 side to the light emitting layer 5 being an organic layer so that an energy barrier of the positive hole injection at each interface reduces as much as possible, and a large energy barrier of the positive hole injection between the electrode 1 and the light emitting layer 5 is supplemented.

Specifically, for example, in the case that ITO (work function 5.0 eV right after UV ozon cleaning) is used for the electrode 1, and Alq3 (HOMO 5.7 eV) is used for the light emitting layer 5, it is preferable that a mixture of TFB (work function 5.4 eV) and a transition metal-containing nanoparticle (work function from 5.0 eV to 5.7 eV) is selected as a material constituting the positive hole injection transport layer, and layers are arranged so as to have a layer constitution in which the value of the work function of each layer is sequentially larger from the electrode 1 side to the light emitting layer 5. The value measured by photoelectron spectroscopy by means of a photoelectron spectrometer (product name: AC-1; manufactured by Riken Keiki Co., Ltd.) is used for the value of the work function or HOMO described above.

In the case of such a layer constitution, the large energy barrier of the positive hole injection between the electrode 1 (work function 5.0 eV right after UV ozon cleaning) and the light emitting layer 5 (for example, HOMO 5.7 eV) can be supplemented so that the vales of HOMO become stepwise. Therefore, the positive hole injection transport layer having an excellent positive hole injection efficiency can be obtained.

(Light Emitting Layer)

As shown in FIGS. 2 to 4, the light emitting layer 5 is formed of an emitting material between the substrate 7 on which the electrode 1 is formed and the electrode 6.

The material used for the light emitting layer of the present invention is not particularly limited as long as it is generally used for the emitting material, and either a fluorescent material or a phosphorescent material can be used. More specifically, materials such as a dye based light emitting material and a metal complex based light emitting material can be exemplified, and either a low molecular weight compound or a polymer compound can be used.

(Specific Example of Dye Based Light Emitting Material)

Examples of the dye based light emitting material include arylamine derivatives, anthracene derivatives, (phenylanthracene derivatives), oxadiazole derivatives, oxazole derivatives, oligothiophene derivatives, carbazole derivatives, cyclopentadiene derivatives, silole derivatives, distyryl benzene derivatives, distyryl pyrazine derivatives, distyryl arylene derivatives, silole derivatives, stilbene derivatives, spiro compounds, thiophene ring compounds, tetraphenylbutadiene derivatives, triazole derivatives, triphenylamine derivatives, trifumanylamine derivatives, pyrazoloquinoline derivatives, hydrazone derivatives, pyrazoline dimers, pyridine ring compounds, fluorene derivatives, phenanthrolines, perinone derivatives, and perylene derivatives. In addition, a dimer, trimer or oligomer thereof, or a compound containing two or more kinds of derivatives can be used.

These materials may be used alone or in combination of two or more kinds.

(Specific Example of Metal Complex Based Light Emitting Material)

Examples of the metal complex based light emitting material include an aluminum quinolinol complex, a benzoquinolinol beryllium complex, a benzoxazole zinc complex, a benzothiazole zinc complex, an azomethyl zinc complex, a porphyrin zinc complex, and an europium complex; and a metal complex which has a central metal including Al, Zn, Be or the like or a rare-earth metal such as Tb, Eu, Dy, and has a ligand such as oxadiazole, thiadiazole, phenylpyridine, phenylbenzimidazole, and quinoline structure.

These materials may be used alone or in combination of two or more kinds.

(Polymer Light Emitting Material)

As the polymer light emitting material, a polymer or a dendrimer in which the above low molecular weight material is introduced in a molecule as a straight chain, a side chain, or a functional group can be used. The examples include poly p-phenylenevinylene derivatives, polythiophene derivatives, poly p-phenylene derivatives, polysilane derivatives, polyacetylene derivatives, polyvinylcarbazole derivatives, polyfluorenone derivatives, polyfluorene derivatives, polyquinoxaline derivatives, and copolymers thereof.

(Specific Example of Dopant)

A doping material may be added in the light emitting layer for the purpose of improving light emitting efficiency or changing a light emitting wavelength. In the case of a polymer material, the doping material may be contained in a molecular structure as a light emitting group. Examples of such a doping material include perylene derivatives, coumarin derivatives, rubrene derivatives, quinacridone derivatives, squarylium derivatives, porphyrin derivatives, a styryl dye, tetracene derivatives, pyrazoline derivatives, decacyclene, phenoxazone, quinoxaline derivatives, carbazole derivatives, and fluorene derivatives. In addition, a compound in which a Spiro group is introduced to one of the above derivatives can be used.

These materials may be used alone or in combination of two or more kinds.

In the present invention, as the material for the light emitting layer, either a low molecular weight compound or a polymer compound which emits fluorescence, or a low molecular weight compound or a polymer compound which emits phosphorescence may be used. In the present invention, in the case that a base layer on which the light emitting layer is provided is the positive hole injection transport layer of the present invention, the positive hole injection transport layer forms the charge transfer complex and tends to be insoluble in a nonaqueous solvent such as xylene or the like used for the solution applying method, therefore, as the material for the light emitting layer, it is possible to use the polymer material which can be easily soluble in the nonaqueous solvent such as xylene or the like and forms a layer by the solution applying method. In this case, a polymer compound which emits fluorescence, a polymer compound containing a low molecular weight compound which emits fluorescence, a polymer compound which emits phosphorescence, or a polymer compound containing a low molecular weight compound which emits phosphorescence can be suitably used.

The light emitting layer can be formed of the emitting material by the solution applying method, vapor deposition method or transfer method. A solution applying method similar to those in "Method for producing device" that will be described hereinafter can be used. The vapor deposition method, for example, a vacuum deposition method is a method comprising the steps of charging a material of the light emitting layer in a crucible disposed in a vacuum apparatus; evacuating the inside of the vacuum apparatus to about $10^{-4}$ Pa by means of an appropriate vacuum pump; heating the crucible to evaporate the material of the light emitting layer; and then forming a light emitting layer 5 on a laminate, in which a substrate 7, an electrode 1, a positive hole injection transport layer 2, and a positive hole transport layer 4a are laminated, which is disposed at a position facing the crucible. The transfer method is a method, for example, that the light emitting layer formed on a film in advance by the solution applying method or vapor deposition method is attached on the positive hole injection transport layer 2 provided on the electrode, and the light emitting layer 5 is transferred on the positive hole injection transport layer 2 by heating. In addition, the positive hole injection transport layer side of a laminate in which the film, the light emitting layer 5, and the positive hole injection transport layer 2 are laminated in this order may be transferred on the electrode.

The thickness of the light emitting layer is generally from about 1 to 500 nm, preferably from about 20 to 1,000 nm. In the present invention, the positive hole injection transport layer is suitably formed by the solution applying method, therefore, there is an advantage of being able to reduce the process cost in the case that the light emitting layer is also formed by the solution applying method.

3. Organic Transistor

As another embodiment of the device of the present invention, an organic transistor can be exemplified. Hereinafter, layers constituting the organic transistor will be described using FIGS. 5 and 6.

In the organic transistor of the present invention as shown in FIG. 5, the positive hole injection transport layer 2 is formed on the surfaces of the electrode 1 (source electrode) and the electrode 6 (drain electrode) so that positive hole injection transport property between the electrode 1 and the organic semiconductor layer, and the electrode 6 and the organic semiconductor becomes high, and film stability of the positive hole injection transport layer of the present invention is high. Thereby, it contributes to the achievement of the long driving lifetime.

In the organic transistor of the present invention, as shown in FIG. 6, the positive hole injection transport layer 2 of the present invention may function as the organic semiconductor layer 8.

In addition, in the organic transistor of the present invention, as shown in FIG. 5, the positive hole injection transport layer 2 may be formed on the surfaces of the electrode 1 (source electrode) and electrode 6 (drain electrode), and the positive hole injection transport layer 2 of the present invention, which is made of a different material from that of the positive hole injection transport layer formed on the surface of the electrode may be further formed as the organic semiconductor layer 8.

In the case that the organic transistor as shown in FIG. 5 is formed, as the material which forms the organic semiconductor layer, a low molecular or polymer organic semiconductor material having a donating property (p type) can be used.

As the organic semiconductor material, examples to be used include porphyrin derivatives, arylamine derivatives, polyacene derivatives, perylene derivatives, rubrene derivatives, coronene derivatives, perylene tetracarboxylic acid diimide derivatives, perylene tetracarboxylic dianhydride derivatives, polythiophene derivatives, poly p-phenylene derivatives, poly p-phenylenevinylene derivatives, polypyrrole derivatives, polyaniline derivatives, polyfluorene derivatives, polythiophenevinylene derivatives, polythiophene-heterocyclic aromatic copolymers and derivatives thereof; α-6-thiophene, α-4-thiophene; oligoacene derivatives such as naphthalene; oligothiophene derivatives of α-5-thiophene, etc.; pyromellitic dianhydride derivatives; and pyromellitic diimide derivatives. Specifically, examples of the porphyrin derivatives include metalphthalocyanine such as phthalocyanine and copper phthalocyanine, examples of the arylamine derivatives include m-TDATA, and examples of the polyacene derivatives include naphthalene, anthracene, naphthacene, and pentacene. In addition, there can be used a layer having improved conductive property by mixing Lewis acid, tetrafluoro tetracyanoquinodimethane ($F_4$-TCNQ), an inorganic oxide such as vanadium or molybdenum with any of the porphyrin derivatives and triphenylamine derivatives.

Even in the case of forming the organic transistor comprising the positive hole injection transport layer of the present invention as shown in FIG. 5, as a compound constituting the organic semiconductor layer 8, it is preferable to use the positive hole transport compound, in particular, the positive hole transport polymer compound is used for the positive hole injection transport layer of the present invention, from the viewpoint of improving the adhesion stability to the interface between the positive hole injection transport layer 2 of the present invention and the organic semiconductor layer 8, and contributing to the achievement of the long driving lifetime.

It is preferable that carrier mobility of the organic semiconductor layer is $10^{-6}$ cm/Vs or more, particularly for the organic transistor, $10^{-3}$ cm/Vs or more is preferable from the view point of transistor property.

In addition, the organic semiconductor layer can be formed by the solution applying method or a dry process similarly as the light emitting layer of the organic EL element.

The substrate, the gate electrode, the source electrode, the drain electrode and the insulating layer may not be particularly limited and can be formed by using the following materials.

The substrate 7 is a support medium of the device of the present invention. The material of the substrate may be, for example, a flexible material or a hard material. Specifically, a similar material to that of "Substrate" of the organic EL element can be used.

The material of the gate electrode, source electrode and drain electrode is not particularly limited if it is a conductive material. However, it is preferable that the material is a metal or a metal oxide from the viewpoint of forming the positive hole injection transport layer 2 wherein the coordination compound containing the metal ion is adsorbed using the charge transport material of the present invention. Specifically, a similar metal or metal oxide to that of the electrode of the organic EL element can be used, particularly, platinum, gold, silver, copper, aluminum, indium, ITO and carbon are preferable.

For the insulating layer which insulates the gate electrode, various kinds of insulating materials can be used. Also, either an inorganic oxide or an organic compound can be used, particularly, an inorganic oxide having high relative permittivity is preferable. Examples of the inorganic oxide include silicon oxide, aluminum oxide, tantalum oxide, titanium oxide, tin oxide, vanadium oxide, barium strontium titanate, barium zirconate titanate, lead zirconate titanate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Among the above, silicon oxide, aluminum oxide, tantalum oxide and titanium oxide are preferable. Also, an inorganic nitride such as silicon nitride, or aluminum nitride can be suitably used.

As the organic compound, a polyimide, a polyamide, polyester, a polyarylate, a photoradical polymerizable or photocationic polymerizable photocurable resin, a copolymer containing an acrylonitrile component, a polyvinylphenol, a polyvinylalcohol, a novolak resin, cyanoethylpullulan, or a phosphazene compound containing a polymer or an elastomer can be used.

Other constitutions of other organic devices such as a dye-sensitized solar battery, an organic thin film solar battery and an organic semiconductor, an oxide compound solar battery and a quantum dot light emitting element having the positive hole injection transporting layer are not particularly limited as long as the above positive hole injection transporting layer is the positive hole injection transporting layer of the present invention, and may be the same as a known constitution.

4. Method for Producing Device

The method for producing the device of the present invention is a method for producing a device comprising the substrate, two or more electrodes facing each other disposed on the substrate and the positive hole injection transport layer disposed between two electrodes among the two or more electrodes comprising: the preparation step of preparing the ink for forming the positive hole injection transport layer containing the transition metal-containing nanoparticle containing the transition metal and/or the transition metal compound and the protecting agent, and the organic solvent; the formation step of forming the positive hole injection transport layer on any of layers on the electrodes using the ink for forming the positive hole injection transport layer; and the oxidation step of oxidizing at least a part of the transition metal and/or transition metal compound in the transition metal-containing nanoparticle to produce the transition metal oxide.

In the method for producing the device of the present invention, the positive hole injection transport layer containing the transition metal-containing nanoparticle is formed of the ink for forming the positive hole injection transport layer by the solution applying method as described above. By using the solution applying method, it is possible to form a device having a high productivity and the adhesion stability of the interface between the electrode and positive hole injection transport layer, and between the positive hole injection transport layer and organic layer, which does not require a vapor deposition apparatus and can coat separately without using a mask vapor deposition or the like upon forming the positive hole injection transport layer.

The solution applying method used herein means a method for preparing the ink for forming the positive hole injection transport layer containing at least the transition metal-containing nanoparticle and the organic solvent, applying the ink on the electrode or on the layer being a base layer, and drying the ink to form the positive hole injection transport layer. The ink for forming the positive hole injection transport layer can be prepared, if necessary, by adding the positive hole transport compound and an additive such as a binder resin which does not trap a positive hole or a coating property improver in a solvent to dissolve and disperse.

Examples of the solution applying method include a dipping method, a spray coating method, a spin coating method, a blade coating method, a dip coating method, a cast method, a roll coating method, a bar coating method, a die-coating method, and a liquid dropping method such as an ink-jet method. In the case of forming a monomolecular film, the dipping method or the dip coating method is suitably used.

The solvent used for the ink is not particularly limited as long as the transition metal-containing nanoparticle and, if necessary, other components such as the positive hole transport compound, etc. can be suitably dissolved or dispersed in the solvent. The examples include toluene, xylene, dodecylbenzene, cyclohexanone, cyclohexanol, tetralin, mesitylene, anisole, methylene chloride, tetrahydrofuran, dichloroethane, chloroform, ethyl benzoate and butyl benzoate.

The method for producing the device of the present invention comprises the oxidation step of oxidizing at least a part of the transition metal and/or transition metal compound of the transition metal-containing nanoparticle to produce the transition metal oxide, thereby, it is possible to form a layer containing a transition metal oxide which does not have solvent solubility not using the vapor deposition method but using the solution applying method. In addition, it is possible to change positive hole injection transport property appropriately while the adhesion to the adjacent organic layer is kept by oxidizing at least a part of the transition metal and/or transition metal compound of the transition metal-containing nanoparticle in the positive hole injection transport layer to produce the transition metal oxide. Furthermore, it is possible to improve film strength by having the oxidation step.

In the method for producing the device of the present invention, after preparing the ink for forming the positive hole injection transport layer, the oxidation step may be performed before forming the positive hole injection transport layer, or after forming the positive hole injection transport layer.

That is, one embodiment of the method for producing the device of the present invention, a method comprising: the preparation step of preparing the ink for forming the positive hole injection transport layer containing the transition metal-containing nanoparticle containing the transition metal and/or transition metal compound and the protecting agent, and the organic solvent; the forming step of forming the positive hole injection transport layer containing the transition metal-containing nanoparticle containing the transition metal and/or transition metal compound and the protecting agent on any of layers on electrodes by using the ink; and the oxidation, step of oxidizing at least a part of the transition metal and/or transition metal compound of the transition metal-containing nanoparticle in the positive hole injection transport layer to produce the transition metal oxide, can be exemplified. By using the above method, the positive hole injection transport layer containing the transition metal-containing nanoparticle containing at least the transition metal compound including the transition metal oxide, the transition metal and the protecting agent, or at least the transition metal compound including the transition metal oxide and the protecting agent can be formed.

As another embodiment of the method for producing the device of the present invention, a method comprising: the oxidation step being performed after the preparation step of preparing the ink for forming the positive hole injection transport layer containing the transition metal-containing nanoparticle containing the transition metal and/or transition metal compound and the protecting agent, and the organic solvent, before the formation step of forming the positive hole injection transport layer; and the preparation step of preparing an ink for forming the oxidized positive hole injection transport layer containing at least the transition metal-containing nanoparticle containing the transition metal oxide, and the organic solvent, can be exemplified. The transition metal-containing nanoparticle in the ink for forming the oxidized positive hole injection transport layer contains at least the transition metal compound including the transition metal oxide, the transition metal and the protecting agent, or at least the transition metal compound including the transition metal oxide and the protecting agent. Then, using the oxidized ink for forming the positive hole injection transport layer, the positive hole injection transport layer containing the transition metal-containing nanoparticle, which contains at least the transition metal compound including the transition metal oxide, the transition metal and the protecting agent, or at least transition metal compound including the transition metal oxide and the protecting agent, can be formed. After the layer is formed, another oxidation step may be further performed.

Examples of means of oxidizing at least a part of the transition metal and/or transition metal compound in the transition metal-containing nanoparticle in the positive hole injection transport layer include a heating process, a light irradiation process, and a process of using active oxygen, and they may be appropriately used in a combination. Since oxidation is efficiently performed in the oxidation step, the oxidation step is preferably performed in the presence of oxygen.

In the case of using the heating process, examples of heating means include a heating method on a hot plate and a heating method in an oven. The heating temperature is preferably from 50 to 250° C. The heating temperature makes a difference in the interaction of the transition metal-containing nanoparticle for the positive hole transport compound, and the interaction between the transition metal-containing nanoparticles, therefore, it is preferable that the heating temperature is appropriately adjusted.

In the case of using the light irradiation process, examples of light irradiation means include a method for exposing ultraviolet, etc. The amount of light irradiation makes a difference in the interaction of the transition metal-containing nanoparticle for the positive hole transport compound, and the interaction between the transition metal-containing nanoparticles, therefore, it is preferable that the amount of irradiation is appropriately adjusted.

In the case of using the process of using active oxygen, examples of means of using active oxygen include a method for using active oxygen generated by ultraviolet, and a method for using active oxygen generated by exposing a photocatalyst such as a titanium oxide or the like to ultraviolet. The amount of active oxygen makes a difference in the interaction of the transition metal-containing nanoparticle for the positive hole transport compound, and the interaction between the transition metal-containing nanoparticles, therefore, it is preferable that the amount of active oxygen is appropriately adjusted.

As for other processes in the method for producing the device, a known process can be appropriately used.

EXAMPLES

Hereinafter, the present invention will be explained further in detail with reference to examples. The scope of the present invention is not limited to the following examples. Herein, in the examples, "part(s)" represents "parts by weight" if not particularly mentioned. The thickness of a layer or film is an average film thickness.

Synthesis Example 1

Molybdenum-containing nanoparticle protected by n-hexadecylamine was synthesized in the following process. In a 25 ml three-neck flask, 0.8 g of n-hexadecylamine (manufactured by KANTO CHEMICAL CO., LTD.) and 12.8 g of n-octyl ether (manufactured by TOKYO CHEMICAL INDUSTRY CO., LTD.) were weighed and charged. The pressure in the flask was reduced while agitating, and the flask was left at room temperature (24° C.) for 1 hour to remove a low-volatility component. The atmosphere was changed from the vacuum atmosphere to air atmosphere, and 0.8 g of molybdenum hexacarbonyl (manufactured by KANTO CHEMICAL CO., LTD.) was added therein. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 20 g of ethanol was added dropwise. Next, a precipitate was separated from the reaction solution by centrifugation followed by performing purification by reprecipitation by the process described below.

That is, the precipitate was mixed with 3 g of chloroform to produce a dispersion, and 6 g of ethanol was added dropwise to the dispersion, thus, a purified precipitate was obtained.

Thus obtained reprecipitate solution was subjected to centrifugation to separate the precipitate from the reaction solution followed by drying, thus, a purified substance of a black molybdenum-containing nanoparticle was obtained.

Synthesis Example 2

Vanadium-containing nanoparticle protected by n-hexadecylamine was synthesized in the following process. In a 50 ml three-neck flask, 0.7 g of vanadium acetylacetonate (manufactured by SIGMA-ALDRICH), 2.4 g of n-hexadecylamine (manufactured by KANTO CHEMICAL CO., LTD.) and 25.0 g of n-octyl ether (manufactured by TOKYO CHEMICAL INDUSTRY CO., LTD.) were weighed and charged. The pressure in the flask was reduced while agitating, and the flask was left at room temperature (24° C.) for 2 hours to remove a low-volatility component. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 55 g of a ethanol/methanol mixed solution (weight ratio is 8:3) was added dropwise. Next, a precipitate was separated from the reaction solution by centrifugation followed by performing purification by reprecipitation by the process described below.

That is, the precipitate was mixed with 6.5 g of chloroform to produce a dispersion, and 13 g of ethanol was added dropwise to the dispersion, thus, a purified precipitate was obtained.

Thus obtained reprecipitate solution was subjected to centrifugation to separate the precipitate from the reaction solution followed by drying, thus, a purified substance of a black vanadium-containing nanoparticle was obtained.

Synthesis Example 3

Tungsten-containing nanoparticle protected by n-hexadecylamine was synthesized in the following process. In a 50 ml three-neck flask, 0.8 g of n-hexadecylamine (manufactured by KANTO CHEMICAL CO., LTD.) and 25.6 g of n-octyl ether (manufactured by TOKYO CHEMICAL INDUSTRY CO., LTD.) were weighed and charged. The pressure in the flask was reduced while agitating, and the flask was left at room temperature (24° C.) for 1 hour to remove a low-volatility component. The atmosphere was changed from the vacuum atmosphere to air atmosphere, and 0.8 g of tungsten hexacarbonyl (manufactured by SIGMA-ALDRICH) was added therein. Thus obtained mixture was heated to 280° C. while agitating under an argon gas atmosphere. The temperature thereof was kept for 1 hour. Then, after cooling the mixture to room temperature (24° C.) and changing the atmosphere from the argon gas atmosphere to air atmosphere, 40 g of ethanol was added dropwise. Next, a precipitate was separated from the reaction solution by centrifugation followed by performing purification by reprecipitation by the process described below.

That is, the precipitate was mixed with 13 g of chloroform to produce a dispersion, and 13 g of ethanol was added dropwise to the dispersion, thus, a purified precipitate was obtained.

Thus obtained reprecipitatate solution was subjected to centrifugation to separate the precipitate from the reaction solution followed by drying, thus, a purified substance of a black tungsten-containing nanoparticle was obtained.

Synthesis Example 4

In a 25 ml three-neck flask, 0.05 g of molybdenum-containing nanoparticle protected by n-hexadecylamine obtained similarly as in Synthesis example 1 was weighed and charged, and 5 g of toluene was added and dispersed therein. 1 g of 1 weight % toluene solution of FO-TPA-OP(O)Cl$_2$ (Chemical formula described below) was added dropwise to the dispersion at room temperature (24° C.) while agitating under an argon gas atmosphere. Then, after the mixture was heated to 60° C. and agitated for 72 hours, it was cooled to room temperature (24° C.) and the atmosphere was changed from the argon gas atmosphere to air atmosphere. Next, 10 g of ethanol was added dropwise to the reaction solution, and a precipitate was separated from the reaction solution by centrifugation, followed by performing purification by reprecipitation by the process described below.

That is, the precipitate was mixed with 5 g of chloroform to produce a dispersion, and 10 g of ethanol was added dropwise to the dispersion, thus, a purified precipitate was obtained.

Thus obtained reprecipitate solution was subjected to centrifugation to separate the precipitate from the reaction solution followed by drying, thus, a purified substance of the molybdenum-containing nanoparticle protected by FO-TPA-OP(O)Cl$_2$ was obtained.

[Chemical formula 9]

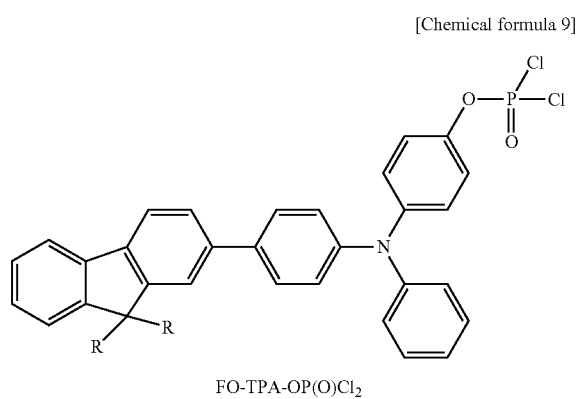

FO-TPA-OP(O)Cl$_2$ wherein each R represents an octyl group.

Comparative Synthesis Example 1

Production of MoO$_3$ Slurry

In a paint shaker, 0.3 g of MoO$_3$ powder was mixed with 30 g of toluene solvent and zirconia beads having a diameter of 3 mm, and dispersed in the solvent while performing physical pulverization to obtain a toluene dispersion of MoO$_3$. Next, the dispersion was dispersed with zirconia beads having a diameter of 0.3 mm for 24 hours, and the supernatant of the dispersion was filtered using a filter having a thickness of 0.2 µm to produce a MoO$_3$ slurry.

[Measurement of Particle Diameter]

Figure 7:
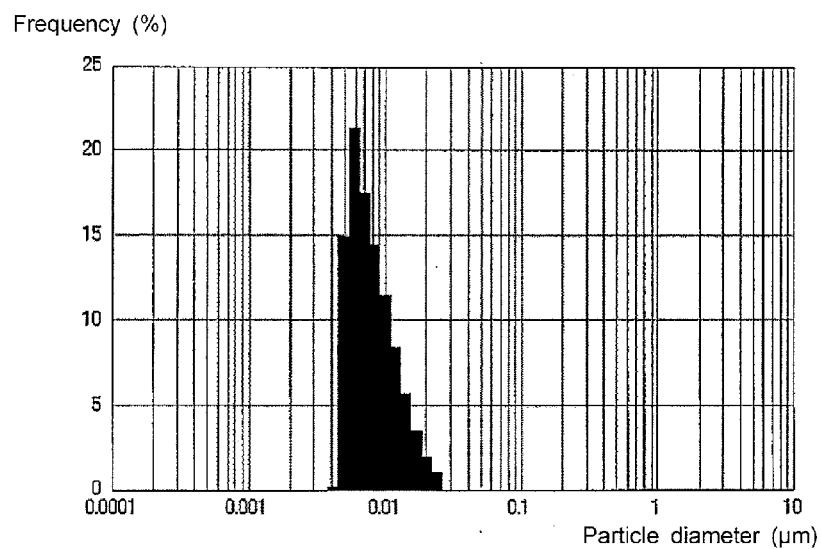
FIG. 7 is a view showing a result of measuring the particle diameter of a transition metal-containing nanoparticle.

The particle diameter of the transition metal-containing nanoparticle obtained in Synthesis examples 1 to 4 was measured by a dynamic light scattering method. The measurement was performed by means of a dynamic light scattering measurement apparatus (product name: Nanotrac Particle Size Analyzer UPA-EX150; manufactured by NIKKISO CO., LTD.). As a measurement sample, a solution in which a transition metal-containing nanoparticle was dispersed in chloroform (concentration: 4.6 mg/ml) was used. The number average particle size of the molybdenum-containing nanoparticle in Synthesis example 1 was 6.2 nm. The measurement result of Synthesis example 1 is shown in FIG. 7. In addition, the number average particle size of the vanadium-containing nanoparticle in Synthesis example 2 was 22.3 nm. The number average particle size of the tungsten-containing nanoparticle in Synthesis example 3 was 10.3 nm. The number average particle size of the molybdenum-containing nanoparticle protected by FO-TPA-OP(O)Cl$_2$ in Synthesis example 4 was 12.4 nm.

In addition, the number average particle size of the MoO$_3$ particle in Comparative synthesis example 1 was 25.0 nm.

[Measurement of Valence of Molybdenum-Containing Nanoparticle]

The valence of the molybdenum-containing nanoparticle was measured by X-ray photoelectron spectroscopy. The measurement was performed by means of ESCA-3400 manufactured by Kratos. As X-ray source used for the measurement, AlKα X-ray was used in Sample 1 described below, and MgKα X-ray was used in Samples 2 to 4 described below. The measurement was performed under accelerating voltage of 10 kV and filament current of 20 mA, without using a monochromator.

(Sample 1: Molybdenum-Containing Nanoparticle Powder)

A measurement sample was produced by placing the molybdenum (Mo)-containing nanoparticle powder in Synthesis example 1 on an aluminum foil and pressing the sample by means of a sample stage to which a carbon tape was attached. The molybdenum-containing nanoparticle was measured one day after synthesis.

The spectrum attributed to 3d5/2 of MoO$_2$ including Mo having an oxidation number of +4 (peak position: 229.5 eV) and the spectrum attributed to 3d5/2 of MoO$_3$ including Mo having an oxidation number of +6 (peak position: 232.5 eV) were observed. The peak derived from the Mo metal including Mo having an oxidation number of 0 was also observed as a shoulder. The reason why the peak of Mo having an oxidation number of 0 was weak and the peak of the molybdenum oxide was dominant is assumed that since only the depth of about 1 nm from the surface of the sample can be measured generally in the case of XPS, Mo metal was present only in the center of the sample, and the oxidized surface was mainly observed. That is, it is presumed that Mo metal, MoO$_2$ and MoO$_3$ are contained together in the nanoparticle.

Figure 9:
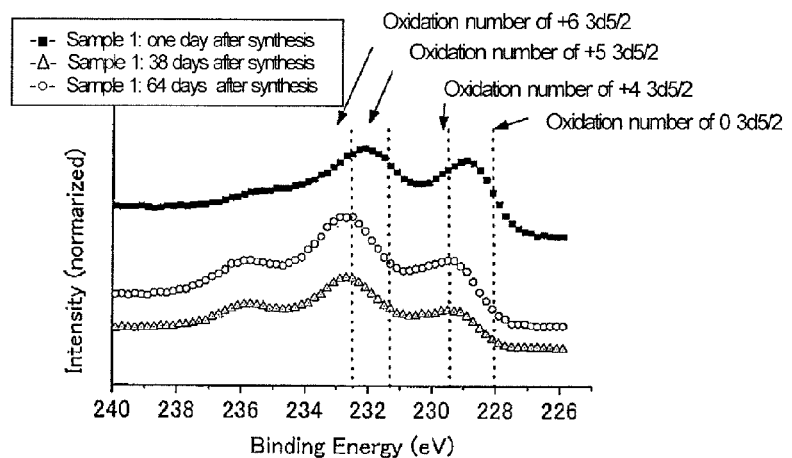
FIG. 9 is a magnified view of a part of XPS spectra obtained one day, 38 days and 64 days after synthesis of Sample 1.

The result of XPS measurement of Sample 1 performed one day, 38 days and 64 days after synthesis is shown in FIG. 9. The result shows that the shoulder peak of Mo having an oxidation number of 0 gradually disappeared, and only peaks of Mo having an oxidation number of +4 and Mo having an oxidation number of +6 were left to denature. The reason thereof is assumed that the nanoparticle is oxidized from the outside of the particle and has a shell structure in which the outer side is made of Mo having an oxidation number of +6 and the inner side is made of Mo having an oxidation number of +4.

(Sample 2: Mo-Containing Nanoparticle Film (10 Nm))

As a measurement sample, an ink was produced by dissolving the Mo-containing nanoparticle in Synthesis example 1 in cyclohexanone in a concentration of 0.5 wt % in the air. The ink was applied on an ITO glass substrate using a spinner in the air, thus, a thin film of the Mo-containing nanoparticle was formed. The thin film was dried at 200° C. for 30 minutes in the air. The spectrum attributed to 3d5/2 of MoO$_3$ (peak position: 232.5 eV) was observed. Furthermore, comparing the spectrum with Sample 3 described below, not only the peak of MoO$_3$ including Mo having an oxidation number of +6 was observed but also the peak which is presumed as Mo having an oxidation number of +5 was observed as a shoulder in the vicinity of 231.2 eV.

(Sample 3: MoO$_3$ Film (20 nm))

A measurement sample was formed by depositing blue-white MoO$_3$ powder (manufactured by Furuuchi Chemical Corporation) on an ITO glass substrate by a resistance heating under vacuum condition (pressure: $1\times10^{-4}$ Pa).

Accordingly, the spectrum attributed to 3d5/2 of MoO$_3$ including Mo having an oxidation number of +6 was only observed.

(Sample 4: Ar Sputtering of Sample 2)

Figure 10:
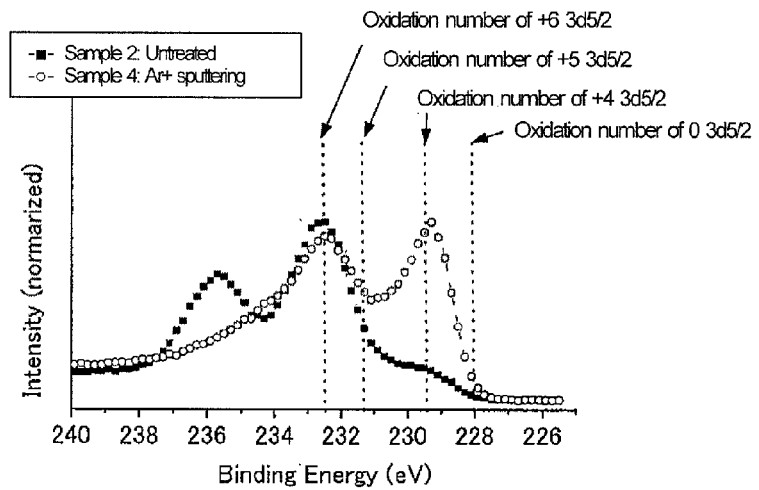
FIG. 10 is a magnified view of a part of XPS spectra of Samples 2 and 4.

The thin film of the Mo-containing nanoparticle obtained in Sample 2 was subjected to sputtering using Ar, and Sample 4, in which about 10 nm from the surface of the thin film was removed, was produced. The XPS spectrum of Sample 4 is shown in FIG. 10. In Sample 4, the peak attributed to MoO$_2$ including Mo having an oxidation number of +4 was observed and the peak of Mo having an oxidation number of 0 was not observed. This result shows that Mo having an oxidation number of +4 which was in the inner side of the nanoparticle surfaced by sputtering. It can be understood from the comparison of Sample 4 with Sample 5 described below that Mo having an oxidation number of +4 is contained in the inner side of the nanoparticle. Sputtering was repeatedly performed until ITO being the base was able to be seen, however, the peak of Mo having an oxidation number of 0 was not observed.

(Sample 5: Ar Sputtering of Sample 3)

Considering the possibility that oxygen was selectively sputtered by Ar sputtering and thus reduced, the XPS measurement was performed in Ar sputtering of Sample 3 similarly as in Sample 4 as a reference of Sample 4.

Figure 11:
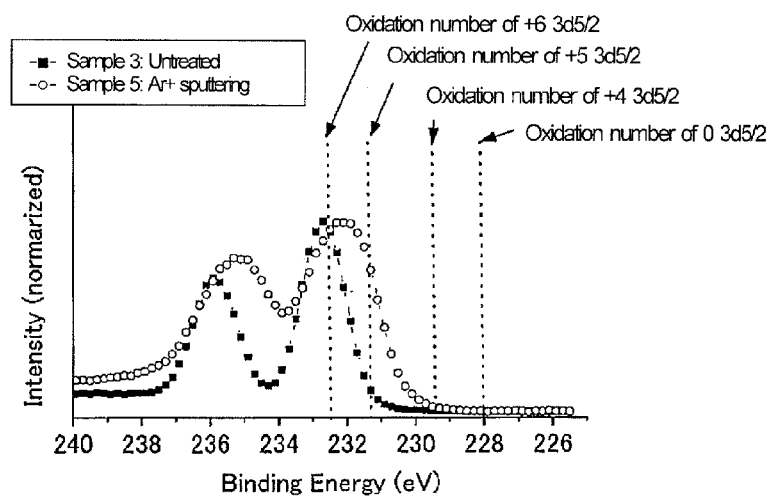
FIG. 11 is a magnified view of a part of XPS spectra of Samples 3 and 5.

The MoO$_3$ film obtained in Sample 3 was subjected to sputtering using Ar, and Sample 5, in which about 10 nm from the surface of the thin film was removed, was produced. The XPS spectrum of Sample 5 is shown in FIG. 11. In Sample 5, Mo having an oxidation number of +5 appeared since oxygen of MoO$_3$ was predominately sputtered, however, Mo having an oxidation number of +4 was not observed. Sputtering was repeatedly performed until ITO being the base was able to be seen, however, the peak of Mo having an oxidation number of +4 was not observed.

[Measurement of Surface Roughness]

The surface shape was measured by means of a probe microscope (product name: Nanopics 1000; manufactured by SII NanoTechnology Inc.,), and an area of 100 μm×100 μm was measured in a tapping mode. The surface shape was compared using center line average roughness "Ra" of the attached software. The center line average roughness "Ra" is a parameter in which the center line average roughness "Ra" defined in JIS B0601 is expanded to three dimension for application applying to the surface of measurement.

(1) Mo-Containing Nanoparticle Film

The Mo-containing nanoparticle obtained in Synthesis example 1 was dissolved in toluene in a concentration of 0.4 weight %, and thus obtained solution was applied on a cleaned ITO glass substrate by a spin coating method, thus, a thin film containing the Mo-containing nanoparticle was formed. The thin film was dried at 200° C. for 30 minutes in the air using a hot plate to evaporate the solvent. The thickness of the positive hole injection transport layer after drying was 10 nm. The Mo-containing nanoparticle which was left for 5 days or more after synthesis in the air did not dissolve in toluene, however, the material right after synthesis stably dissolved in toluene.

"Ra" of the Mo nanoparticle film was measured, and was 0.42 nm.

(2) Mixed Film of Mo-Containing Nanoparticle and TFB

The Mo-containing nanoparticle obtained in Synthesis example 1 and TFB (poly[(9,9-dioctylfluorenyl-2,7-diyl)-co-(4,4'-(N-(4-sec-butylphenyl))diphenylamine)]) were respectively dissolved in toluene in a concentration of 0.2 weight %, and thus obtained solution was applied on a cleaned ITO glass substrate by a spin coating method, thus, a mixed film of the Mo-containing nanoparticle and TFB was formed. The mixed film was dried at 200° C. for 30 minutes in the air using a hot plate to evaporate the solvent. The thickness of the positive hole injection transport layer after drying was 10 nm.

"Ra" of the Mo nanoparticle film was measured, and was 1.08 nm. The reason why the surface of the mixed film of Mo-containing nanoparticle and TFB was rougher than that of the Mo-containing nanoparticle film in the above (1) is assumed that the compatibility of the protecting agent in the Mo-containing nanoparticle with TFB was poor (SA-SB=2.3). SA-SB was determined as described in Table. 2.

(3) Mixed Film of Mo-Containing Nanoparticle with TPA-TFA and TFB

The Mo-containing nanoparticle with TPA-FO obtained in Synthesis example 4 was dissolved in toluene in a concentration of 0.4 weight %, and thus obtained solution was applied on a cleaned ITO glass substrate by a spin coating method, thus, a thin film containing the Mo-containing nanoparticle was formed. The thin film was dried at 200° C. for 30 minutes in the air using a hot plate to evaporate the solvent. The thickness of the positive hole injection transport layer after drying was 10 nm.

"Ra" of the mixed film was measured, and was 0.35 nm. The reason why the surface of this mixed film was smoother than that of the Mo-containing nanoparticle film in the above (1) is assumed that the compatibility of the protecting agent in the Mo-containing nanoparticle with TFB was excellent (SA-SB=0.3). SA-SB was determined as described in Table. 2.

TABLE 2

| | Mo-containing nanoparticle in Synthesis example 1 and TFB | Mo-containing nanoparticle in Synthesis example 4 and TFB |
|---|---|---|
| Positive hole transport compound | | |
| Moiety A | | |

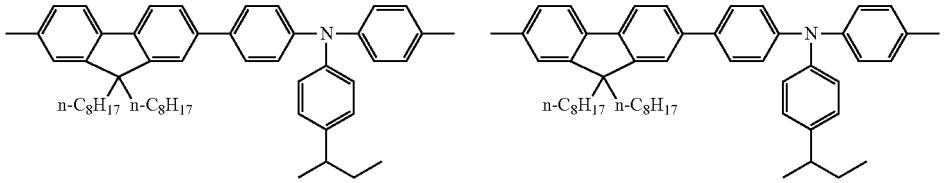

TABLE 2-continued

| | Mo-containing nanoparticle in Synthesis example 1 and TFB | Mo-containing nanoparticle in Synthesis example 4 and TFB |
|---|---|---|
| Protecting agent in nanoparticle | | |
| Moiety B | n-C$_6$H$_{13}$— | 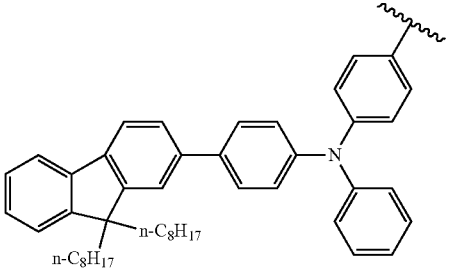 |
| Sum atomic weight MA of moiety A | 688 | 688 |
| Sum atomic weight MB of moiety B | 85 | 633 |
| \|MA-MB\|/MB | 7.1 | 0.1 |
| SA | 18.8 | 18.8 |
| SB | 16.5 | 19.1 |
| \|SA-SB\| | 2.3 | 0.3 |

Example 1

On a glass substrate, a transparent anode, a laminate of a layer containing a Mo-containing nanoparticle and a layer containing a positive hole transport compound as a positive hole injection transport layer, a positive hole transport layer, a light emitting layer, an electron injection layer, and a cathode were formed as layers in this order and laminated. Then, sealing was finally performed to produce an organic EL element. The layers except the transparent anode and the positive hole injection transport layer were formed in a nitrogen purged glove box with water concentration of 0.1 ppm or less and oxygen concentration of 0.1 ppm or less.

Firstly, a thin film (thickness: 150 nm) of Indium Tin Oxide (ITO) was used as the transparent anode. A glass substrate with ITO (manufactured by Sanyo vacuum industries Co., Ltd.) was subjected to patterning in the form of stripe. The ITO substrate subjected to patterning was subjected to ultrasonic cleaning using a neutral detergent and ultrapure water in this order followed by UV-ozonation. HOMO of ITO after performing UV-ozonation was 5.0 eV.

Next, the Mo-containing nanoparticle obtained in Synthesis example 1 described above was dissolved in ethyl benzoate in a concentration of 0.4 weight % to prepare an ink for forming a positive hole injection transport layer (1).

Then, the ink for forming the positive hole injection transport layer (1) was applied on a cleaned anode by a spin coating method to form a positive hole injection transport layer containing the transition metal-containing nanoparticle. After applying the ink for forming the positive hole injection transport layer (1), the positive hole injection transport layer (1) was dried at 200° C. for 30 minutes using a hot plate to evaporate the solvent. The thickness of the positive hole injection transport layer (1) after drying was 10 nm.

Next, on thus produced positive hole injection transport layer (1), a thin film (thickness: 10 nm) of poly[(9,9-dioctylfluorenyl-2,7-diyl)-co-(4,4'-(N-(4-sec-butylphenyl))diphenylamine)] (TFB) being a conjugated polymer material was formed as a positive hole injection transport layer (2). It was formed by applying a solution in which TFB was dissolved in xylene in a concentration of 0.4 weight % by a spin coating method. After applying the TFB solution, the positive hole injection transport layer (2) was dried at 200° C. for 30 minutes using a hot plate to evaporate the solvent.

Then, on thus formed positive hole injection transport layer (2), a thin film (thickness: 100 nm) of bis(N-(1-naphthyl-N-phenyl)benzidine) (α-NPD) was formed as the positive hole transport layer. Further, on the positive hole transport layer, a thin film (thickness: 60 nm) of tris(8-hydroxyquinolinato) aluminum complex (Alq$_3$) was formed as the light emitting layer. The positive hole transport layer and the light emitting layer were formed under vacuum condition (pressure: 1×10$^{-4}$ Pa) by a resistance heating vapor deposition method.

Next, on thus produced light emitting layer, a film (thickness: 0.5 nm) of lithium fluoride (LiF) as the electron injection layer and a film (thickness: 100 nm) of Al as the cathode were sequentially formed under vacuum condition (pressure: 1×10$^{-4}$ Pa) by a resistance heating vapor deposition method.

Finally, after forming the cathode, the above layers were sealed in the glove box using alkali-free glass and a UV curable epoxy bonding agent, thus, the organic EL element of Example 1 was produced.

Example 2

An organic EL element of Example 2 was produced similarly as in Example 1 except that only a layer (one layer) in which TFB and the Mo-containing nanoparticle of Synthesis example 1 were mixed at the weight ratio of 2:1 was formed as the positive hole injection transport layer instead of the positive hole injection transport layer of Example 1, and the positive hole injection transport layer (2) was not formed.

The positive hole injection transport layer was formed by preparing a coating solution for forming the positive hole injection transport layer in which TFB and the Mo-containing nanoparticle were dissolved in ethyl benzoate at the weight ratio of 2:1 in a concentration of 0.4 weight %, and applying the coating solution for forming the positive hole injection transport layer on the cleaned anode by a spin coating method. After applying the coating solution for forming the positive hole injection transport layer, the positive hole injection transport layer was dried at 200° C. for 30 minutes using a hot plate to evaporate the solvent. The thickness of the positive hole injection transport layer after drying was 10 nm.

Example 3

An organic EL element of Example 3 was produced similarly as in Example 2 except that the positive hole injection transport layer was dried at 100° C. for 30 minutes instead of drying at 200° C. for 30 minutes.

Example 4

An organic EL element of Example 4 was produced similarly as in Example 1 except that the layer in which, instead of TFB, TFB and the transition metal-containing nanoparticle were mixed at the weight ratio of 2:1 was used as the positive hole injection transport layer (2).

The positive hole injection transport layer (2) was formed by preparing the coating solution for forming the positive hole injection transport layer (2) in which TFB and the transition metal-containing nanoparticle were dissolved in ethyl benzoate at the weight ratio of 2:1 in a concentration of 0.4 weight %, and applying the coating solution for forming the positive hole injection transport layer (2) on the formed positive hole injection transport layer (1) by a spin coating method. After applying the coating solution for forming the positive hole injection transport layer (2), the positive hole injection transport layer (2) was dried at 200° C. for 30 minutes using a hot plate to evaporate the solvent. The thickness of the positive hole injection transport layer (2) after drying was 10 nm.

Comparative Example 1

An organic EL element of Comparative example 1 was produced similarly as in Example 1 except that only a thin film (thickness: 10 nm) of TFB was formed as the positive hole injection transport layer.

Comparative Example 2

An organic EL element of Comparative example 2 was produced similarly as in Comparative example 1 except that a thin film (thickness: 1 nm) of a molybdenum oxide ($MoO_3$) was formed instead of forming the thin film of TFB as the positive hole injection transport layer.

The thin film of $MoO_3$ was formed under vacuum condition (pressure: $1\times10^{-4}$ Pa) by a resistance heating vapor deposition method.

The organic EL elements produced in the above Examples and Comparative examples emitted green light derived from $Alg_3$, and were evaluated for their applied voltage upon driving at 10 mA/cm$^2$ and lifetime property by the following methods. The results are shown in Table 3.

The lifetime property of the organic EL element was evaluated by observing luminance which was gradually decreasing over time in a constant current driving. Herein, time (hr.) until the retention of luminance decreases to 80% with respect to the initial luminance of 5,000 cd/m$^2$ was determined as a lifetime (LT 80).

TABLE 3

| Positive hole injection transport layer | | 10 mA/cm$^2$ upon driving Applied voltage (V) | Elapsed time at retention of 80% in a constant current driving initiated at initial luminance of 5,000 cd/m$^2$ (hr.) LT80 |
|---|---|---|---|
| Example 1 | Laminate of Mo-containing nanoparticle (10 nm)/TFB (10 nm) | 9.5 | 18 |
| Example 2 | TFB:Mo-containing nanoparticle = 2:1 (10 nm) (drying at 200° C.) | 5.7 | 33 |
| Example 3 | TFB:Mo-containing nanoparticle = 2:1 (10 nm) (drying at 100° C.) | 7.1 | 25 |
| Example 4 | Laminate of Mo-containing nanoparticle (10 nm)/ TFB:Mo-containing nanoparticle = 2:1 (10 nm) | 6.4 | 55 |
| Comparative example 1 | TFB (10 nm) | 16.5 | 0.3 |
| Comparative example 2 | $MoO_3$ (1 nm) | 5.1 | 13 |

<Results>

Comparing Comparative example 1 with Example 1, driving voltage was lower and lifetime property LT 80 was longer in Example 1 in which the transition metal-containing nanoparticle and TFB were laminated than those in Comparative example 1 in which only TFB was used for the positive hole injection transport layer. The reasons thereof are assumed that the transition metal-containing nanoparticle and TFB interacted at the interface of layers, thus, the charge injection property to TFB and the stability of charge transport of TFB improved, and further, the positive hole injection transport layer (1) contained the transition metal-containing nanoparticle so that the affinity of the positive hole injection transport layer with the adjacent electrode (ITO) and positive hole transport layer (α-NPD) increased, thus, the adhesion stability of the interface between layers improved.

Furthermore, comparing Comparative example 1 with Example 2 and Example 3, driving voltage was lower and lifetime property LT 80 was longer in Example 2 and Example 3 in which the transition metal-containing nanoparticle was mixed in TFB than that in Comparative example 1. The reason is assumed that the transition metal-containing nanoparticle and TFB were mixed so that they were easily interacted, thus, charge injection property and the stability of charge transport further improved. Drying temperature made a difference in properties of Examples 2 and 3, therefore, it is considered that heating temperature makes a difference in the interaction of the transition metal-containing nanoparticle for the positive hole transport compound, and the interaction between the transition metal-containing nanoparticles.

That is, it is expected that lifetime property LT 80 is longer at drying of 200° C. than that at drying at 100° C. because the interaction between the transition metal-containing nanoparticle and TFB and the interaction between the transition metal-containing nanoparticles are strong at drying of 200° C., and the interaction by heating is weaker at drying of 100° C. than that of drying of 200° C. In addition, the driving voltage also decreased from 5.6 V to 5.3 V, thereby, it is presumed that there is a difference in the interaction with ITO being a substrate similarly as the above.

The positive hole injection transport layer of Example 4 is a laminate of the layer of the transition metal-containing nanoparticle and the mixed layer of TFB and the transition metal-containing nanoparticle (combination of Example 1 and Example 2), the layer of the transition metal-containing nanoparticle was inserted between the electrode (ITO) and the mixed layer, thereby, the driving voltage further lowered. The reason thereof is assumed that the metal and ligand were contained in the transition metal-containing nanoparticle at the interface of the electrode (ITO) and the mixed layer so that the affinity between ITO and THF increased, thereby, the adhesion stability of the interface improved.

The lifetime property LT 80 of Examples 1 to 4 were longer than that of Comparative example 2 using $MoO_3$. The reason thereof is assumed that the adhesion of the interface between the electrode (ITO) and the positive hole transport layer "a" (TFB) was higher in the case of using the transition metal-containing nanoparticle containing an inorganic and organic substance than that in the case of using $MoO_3$ being the inorganic substance.

Example 5

On a glass substrate with a transparent anode, a laminate of a layer containing the Mo-containing nanoparticle (positive hole injection layer) and a layer containing the positive hole transport compound (positive, hole transport layer) as the positive hole injection transport layer, a light emitting layer, a positive hole block layer, an electron transport layer, an electron injection layer, and a cathode were formed as layers in this order and laminated. Then, sealing was finally performed to produce an organic EL element.

Firstly, a thin film (thickness: 150 nm) of Indium Tin Oxide (ITO) was used as the transparent anode. A glass substrate with ITO (manufactured by Sanyo vacuum industries Co., Ltd.) was subjected to patterning in the form of stripe. The ITO substrate subjected to patterning was subjected to ultrasonic cleaning using a neutral detergent and ultrapure water in this order followed by UV-ozonation.

Next, the Mo-containing nanoparticle obtained in Synthesis example 1 described above was dissolved in cyclohexanone in a concentration of 0.4 wt % to prepare an ink for forming the positive hole injection transport layer (1). Then, the ink for forming the positive hole injection transport layer (1) was applied on a cleaned anode by a spin coating method to form a positive hole injection transport layer containing the Mo-containing nanoparticle. After applying the ink for forming the positive hole injection transport layer (1), the positive hole injection transport layer was dried at 200° C. for 30 minutes using a hot plate to evaporate the solvent. The thickness of the positive hole injection transport layer (1) after drying was 10 nm. All of the above application and drying process of the positive hole injection transport layer (1) were performed in the air.

Next, on thus produced positive hole injection transport layer (1), a thin film (thickness: 30 nm) of TFB being a conjugated polymer material was formed as the positive hole injection transport layer (2). It was formed by applying the solution in which TFB was dissolved in xylene in a concentration of 0.7 weight % by a spin coating method. After applying the solution of TFB, the positive hole injection transport layer (2) was dried at 200° C. for 30 minutes using a hot plate to evaporate the solvent.

Then, on thus produced positive hole injection transport layer (2), a mixed thin film containing tris(2-phenylpyridine) iridium (III) ($Ir(ppy)_3$) as a luminescent dopant and 4,4'-bis (2,2-carbazole-9-il)biphenyl (CBP) as host was formed by deposition as a light emitting layer. The mixed thin film was formed by codeposition under vacuum condition (pressure: $1 \times 10^{-4}$ Pa) by a resistance heating method so that the volume ratio of the host and the dopant was 20:1, and the total thickness of the film was 40 nm.

Next, on thus produced light emitting layer, a thin film of bis(2-methyl-8-quinolinolato)(p-phenylphenolato)aluminum complex (BAlq) was formed by deposition as a positive hole block layer. The thin film of BAlq was formed under vacuum condition (pressure: $1 \times 10^{-4}$ Pa) by a resistance heating method so that the thickness of the film was 15 nm.

Then, on the positive hole block layer, a thin film of tris(8-hydroxyquinolinato)aluminum complex ($Alq_3$) was formed by deposition under vacuum condition (pressure: $1 \times 10^{-4}$ Pa) by a resistance heating method as an electron transport layer so that the thickness of the film was 15 nm.

Then, on thus produced light emitting layer, a film (thickness: 0.5 nm) of LiF as the electron injection layer and a film (thickness: 100 nm) of Al as the cathode were sequentially formed under vacuum condition (pressure: $1 \times 10^{-4}$ Pa) by a resistance heating vapor deposition method.

Finally, after forming the cathode, the above layers were sealed in the glove box using alkali-free glass and a UV curable epoxy bonding agent, thus, the organic EL element of Example 5 was produced. Thus produced element emitted green light derived from $1r(ppy)_3$.

Example 6

An organic EL element of Example 6 was produced similarly as in Example 5 except that the tungsten-containing nanoparticle obtained in Synthesis example 3 was used as the transition metal nanoparticle used for the positive hole injection transport layer (1) instead of the Mo-containing nanoparticle.

Example 7

An organic EL element of Example 7 was produced similarly as in Example 5 except that the vanadium-containing nanoparticle obtained in Synthesis example 2 was used as the transition metal nanoparticle used for the positive hole injection transport layer (1) instead of the Mo-containing nanoparticle.

Example 8

An organic EL element of Example 8 was produced similarly as in Example 5 except that the Mo-containing nanoparticle obtained in Synthesis example 1 and the tungsten-containing nanoparticle obtained in Synthesis example 3 were mixed at the weight ratio of 1:1 and used as the transition metal nanoparticle used for the positive hole injection transport layer (1).

Example 9

An organic EL element of Example 9 was produced similarly as in Example 5 except that after applying the ink for forming the positive hole injection transport layer (1), the positive hole injection transport layer (1) was dried at 200° C. for 30 minutes using a hot plate to evaporate the solvent, and further subjected to forced oxidation by UV ozon.

Example 10

An organic EL element of Example 10 was produced similarly as in Example 5 except that a layer in which TFB and the Mo-containing nanoparticle in Synthesis example 1 were mixed at the weight ratio of 2:1 was used as the positive hole injection transport layer (1) in Example 5.

The positive hole injection transport layer (1) was formed by preparing an ink for forming the positive hole injection transport layer (1) in which TFB and the Mo-containing nanoparticle were dissolved in cyclohexanone at the weight ratio of 2:1 in a concentration of 0.4 weight %, and applying the ink for forming the positive hole injection transport layer (1) on a cleaned anode by a spin coating method. After applying the ink for forming the positive hole injection transport layer (1), the positive hole injection transport layer (1) was dried at 200° C. for 30 minutes using a hot plate to evaporate the solvent. The thickness of the positive hole injection transport layer (1) after drying was 10 nm.

Example 11

An organic EL element of Example 11 was produced similarly as in Example 10 except that the Mo-containing nanoparticle obtained in Synthesis example 4 was used instead of the Mo-containing nanoparticle obtained in Synthesis example 1 as the transition metal-containing nanoparticle used for the positive hole injection transport layer (1).

Comparative Example 3

An organic EL element of Comparative example 3 was produced similarly as in Example 5 except that only a thin film (thickness: 10 nm) of TFB was formed as the positive hole injection transport layer.

All of the organic EL elements produced in the above Examples 5 to 11 and Comparative example 3 emitted green light, and were evaluated for their applied voltage upon driving at 10 mA/cm², electric current efficiency, and lifetime property by the following methods. The results are shown in Table 4.

The electric current efficiency was calculated by the current-voltage-luminance (I-V-L) measurement. The I-V-L measurement was performed by grounding a cathode, applying positive direct voltage to an anode with scanning at 100 mV intervals (1 sec./div.), and recording current and luminance of each voltage. The luminance was measured by means of a luminance meter (product name: BM-8; manufactured by TOPCON CORPORATION). Based on the obtained results, electric current efficiency (cd/A) was calculated from luminous area, the current and the luminance.

The lifetime property of the organic EL element was evaluated by observing luminance which was gradually decreasing over time in a constant current driving. Herein, time (hr.) until the retention of luminance decreases to 50% with respect to the initial luminance of 20,000 cd/m² was determined as a lifetime (LT 50).

TABLE 4

| | Positive hole injection transport layer | 10 mA/cm² upon driving Applied voltage (V) | Electric current efficiency (Cd/A) | Elapsed time at retention of 50% in a constant current driving initiated at initial luminance of 20,000 cd/m² (hr.) LT50 |
|---|---|---|---|---|
| Example 5 | Laminate of Mo-containing nanoparticle (10 nm)/TFB (30 nm) | 7.6 | 25 | 28 |
| Example 6 | Laminate of W-containing nanoparticle (10 nm)/TFB (30 nm) | 9.3 | 23 | 7 |
| Example 7 | Laminate of V-containing nanoparticle (10 nm)/TFB (30 nm) | 9.4 | 14 | 3 |
| Example 8 | Laminate of Mo-containing nanoparticle: W-containing nanoparticle (weight ratio 1:1) (10 nm)/TFB (30 nm) | 8.7 | 23 | 5 |
| Example 9 | Laminate of Mo-containing nanoparticle (10 nm) (forced oxidation by oxidation catalyst)/TFB (30 nm) | 7.3 | 26 | 29 |
| Example 10 | Laminate of TFB: Mo-containing nanoparticle (Synthesis example 1) = 2:1 (10 nm)/TFB (30 nm) | 8.0 | 22 | 24 |
| Example 11 | Laminate of TFB: Mo-containing nanoparticle (Synthesis example 4) = 2:1 (10 nm)/TFB (30 nm) | 7.8 | 24 | 28 |
| Comparative example 3 | Only TFB (30 nm) | 10.3 | 4 | <0.1 |

<Results>

It can be understood from the comparison of Examples 5, 6 and 7 with Comparative example 3 that the voltage of the element lowered and the lifetime extended by containing a layer comprising the transition metal nanoparticle of the present invention. The reasons thereof are assumed that the layer comprising the transition metal-containing nanoparticle of the present invention increased the affinity with the adjacent electrode (ITO) and positive hole transport layer "a" (TFB), thus, the adhesion stability of the interface between layers improved.

Example 8 shows that even Mo and W were mixed, excellent properties was exhibited.

Comparing Example 5 with Example 9, the voltage of the element slightly lowered and the lifetime slightly extended in Example 9, in which the element was subjected to forced oxidation, than those in Example 5. This result shows that injection property was able to be controlled by oxidation treatment.

Comparing Example 10 with Example 11, the voltage of the element lowered and the lifetime extended in Example 11, in which a dispersing agent having an excellent affinity with TFB was used, than those in Example 10. This result shows that the dispersing agent itself had positive hole transport property and high compatibility with a binder, thus, the positive hole was smoothly transported and the stability of the film improved in Example 11.

Example 12

An organic EL element of Example 12 was produced similarly as in Example 5 except that a mixed thin film (40 nm) containing 1-tert-butyl-perylene (TBP) as a luminescent dopant and 2-methyl-9,10 bis(naphthalene-2-yl)anthracene (MADN) as a host was formed by application as a light emitting layer. The mixed thin film was formed by applying a solution in which MADN and TBP were dissolved in toluene so that the weight ratio of MADN and TBP as a solid content was 20:1 in a solid content concentration of 1.0 weight % by a spin coating method. After applying the solution, the mixed thin film was dried at 100° C. for 10 minutes using a hot plate to evaporate the solvent. Thus produced element emitted blue light derived from TBP.

Comparative Example 4

An organic EL element of Comparative example 4 was produced similarly as in Example 12 except that the positive hole injection transport layer (1) was formed by applying the slurry produced in Comparative synthesis example 1. The solid content of the slurry in Comparative synthesis example 1 was unknown, however, the positive hole injection transport layer (1) was formed by applying the slurry by the spin coating method, and the thickness of the positive hole injection transport layer (1) was measured after applying the slurry, which was about 10 nm. After applying the solution, the positive hole injection transport layer (1) was dried at 100° C. for 10 minutes using a hot plate to evaporate the solvent. Thereby, it slightly became clouded. The produced element emitted blue light derived from TBP, and it was prone to short out.

TABLE 5

| | Positive hole injection transport layer | 10 mA/cm² upon driving Applied voltage (V) | Electric current efficiency (Cd/A) | Elapsed time at retention of 50% in a constant current driving initiated at initial luminance of 2,000 cd/m² (hr.) LT50 |
|---|---|---|---|---|
| Example 12 | Laminate of Mo-containing nanoparticle (10 nm)/TFB (30 nm) | 7.6 | 1.2 | 60 |
| Comparative example 4 | Laminate of Mo slurry (estimated 10 nm)/TFB (30 nm) | 8.5 | 0.7 | 10 |

<Results>

Comparing Example 12 with Comparative example 4, the element in Example 12 was driven at lower voltage and had a longer lifetime than that in Comparative example 4. The reasons thereof are assumed that the size uniformity of the Mo nanoparticle of the present invention was higher than that of the $MoO_3$ slurry produced by physical pulverization, and the molybdenum had a shell structure of the complex having an oxidation number of +4, +5 and +6, and thus these contributed to lowering the voltage and extending the lifetime. In addition, in Comparative example 4, although fine dispersion was observed as the result of particle size distribution measurement was about 25 nm, it is assumed from the clouded thin film that the particles easily aggregated upon forming a film, or the dispersion stability of the ink by itself was low.

Example 13

On a glass substrate, an anode, a layer containing a transition metal-containing nanoparticle as a positive hole injection transport layer, an organic semiconductor layer and a cathode were formed as layers in this order and laminated. Then, sealing was finally performed to produce an organic diode element. The organic semiconductor layer was produced in a nitrogen purged glove box with water concentration of 0.1 ppm or less and oxygen concentration of 0.1 ppm or less.

Firstly, a glass substrate (manufactured by Sanyo vacuum industries Co., Ltd.) was subjected to ultrasonic cleaning using water, acetone and IPA (isopropyl alcohol) in this order. Then, chrome (Cr) (thickness: 5 nm) and Au (thickness: 45 nm) were formed as the anode under vacuum condition (pressure: $5 \times 10^{-4}$ Pa) by a resistance heating vapor deposition method.

After a gold electrode was produced, UV-ozonation was performed and a positive hole injection transport layer (10 nm) containing the transition metal-containing nanoparticle was formed on a cleaned anode by a spin coating method. As a coating solution, a solution in which the transition metal-containing nanoparticle obtained in the above Synthesis example 1 was dispersed in ethyl benzoate in a concentration of 0.4 weight % was used. After forming a thin film, the positive hole injection transport layer was dried at 200° C. for 30 minutes using a hot plate to evaporate the solvent.

Next, on thus produced positive hole injection transport layer, a thin film (thickness: 100 nm) of poly(3-hexylthiophene) (P3HT) being a conjugated polymer material was formed as an organic semiconductor layer.

Next, on thus produced organic semiconductor layer, a film (thickness: 100 nm) of Al was formed as the cathode under vacuum condition (pressure: $5 \times 10^{-4}$ Pa) by a resistance heating vapor deposition method.

Finally, after forming the cathode, the above laminate was sealed in the glove box using alkali-free glass and a UV curable epoxy adhesive, thus, the organic diode element of Example 13 was produced.

Comparative Example 5

An organic diode element of Comparative example 5 was produced similarly as in Example 13 except that the positive hole injection transport layer was not used.

The organic diode element produced in the above Examples and Comparative examples were evaluated for their current-voltage property, AC-DC conversion characteristic, and lifetime property by the following methods. The results are shown in Table 6.

Figure 8:
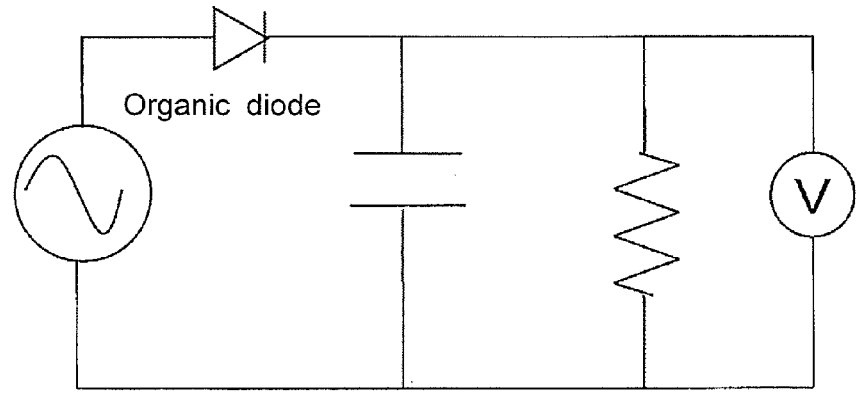
FIG. 8 is a view showing a circuit used for the evaluation of AC-DC conversion characteristic in Example 5 and Comparative example 3.

The AC-DC conversion characteristic of the organic diode element was determined by measuring the potential difference between both sides of resistance (100 kΩ) by means of a voltmeter upon applying sine wave (amplitude: 5V; frequency: 13.56 MHz) to the circuit 1 shown in FIG. 8. The lifetime property of the organic diode element was evaluated by observing current which was gradually decreasing over time in a DC constant voltage (5V) driving. In Example 13 and Comparative example 5, time (hr.) until the retention decreases to 50% with respect to the initial current value was determined as a lifetime.

TABLE 6

| Positive hole injection transport layer | Upon applying DC Current upon forward bias (A) | Lifetime (h) | Upon applying AC Converted DC voltage |
|---|---|---|---|
| Example 13 | Mo-containing nanoparticle (10 nm) 3.32E−5 | 100 or more | 2 |
| Comparative example 5 | — 1.54E−5 | 0.5 | 1.6 |

<Results>
Comparing Example 13 with Comparative example 5, the current upon forward bias increased and the converted DC voltage also increased in Example 13, in which the transition metal-containing nanoparticle was used, compared with those in Comparative example 5. In addition, the lifetime property also improved in Example 13. The reasons thereof are assumed that the transition metal-containing nanoparticle and P3HT interacted at the interface of layers, thus, the charge injection property to P3HT and the stability of charge transport of P3HT improved, and further, the affinity of the positive hole transport layer with the adjacent electrode (Au) and organic semiconductor layer (P3HT) was increased by the transition metal-containing nanoparticle, thus, the adhesion stability of the interface between layers improved.

The invention claimed is:

1. A positive hole injection transport layer-forming ink for producing a transition metal-containing nanoparticle containing at least a protecting agent, a transition metal and a transition metal compound including a transition metal oxide, or at least a protecting agent and a transition metal compound including a transition metal oxide,
the ink comprising an organic solvent and a transition metal-containing nanoparticle containing a protecting agent and a transition metal and/or transition metal compound,
wherein a surface of the nanoparticles is attached to the protecting agent which protects the surface of the nanoparticles; the protecting agent contains an organic group and one linking group at the end of the organic group in one molecule; the linking group functions to connect to the transition metal and/or the transition metal compound; the organic group is one or more selected from the group consisting of a linear or branched saturated or unsaturated alkyl group having 4 to 30 carbon atoms, and benzene, triphenylamine, fluorene, biphenyl, pyrene, anthracene, carbazole, phenylpyridine, trithiophene, phenyloxadiazole, phenyltrizaole, benzimidazole, phenyltriazine, benzodiathiazine, phenylquinoxaline, phenylenevinylene, phenylsilole and combinations thereof, each of which may have a substituent selected from the group consisting of a linear or branched alkyl group having 1 to 20 carbon atoms, a halogen atom, an alkoxy group having 1 to 20 carbon atoms, a cyano group and a nitro group; and the linking group is one or more kinds selected from the group consisting of a hydroxyl group, a sulfonic acid group, a sulfonamide group and functional groups represented by the following general formulae (1-a) to (1-l):

[Chemical Formula 1]

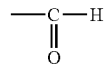
(1-a)

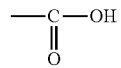
(1-b)

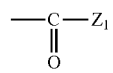
(1-c)

(1-d)

(1-e)

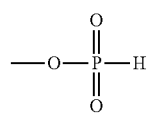
(1-f)

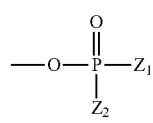
(1-g)

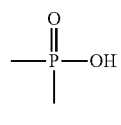
(1-h)

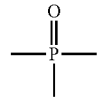
(1-i)

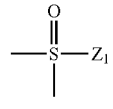
(1-j)

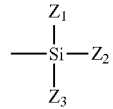
(1-k)

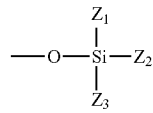
(1-l)

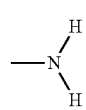

wherein each of $Z_1$, $Z_2$ and $Z_3$ independently represents a halogen atom or an alkoxy group.

2. A positive hole injection transport layer-forming ink comprising an organic solvent and a transition metal-containing nanoparticle containing at least a protecting agent, a transition metal and a transition metal compound including a transition metal oxide, or at least a protecting agent and a transition metal compound including a transition metal oxide,
wherein a surface of the nanoparticles is attached to the protecting agent which protects the surface of the nanoparticles; the protecting agent contains an organic group and one linking group at the end of the organic group in one molecule; the linking group functions to connect to the transition metal and/or the transition metal compound; the organic group is one or more selected from the group consisting of a linear or branched saturated or unsaturated alkyl group having 4 to 30 carbon atoms, and benzene, triphenylamine, fluorene, biphenyl, pyrene, anthracene, carbazole, phenylpyridine, trithiophene, phenyloxadiazole, phenyltrizaole, benzimidazole, phenyltriazine, benzodiathiazine, phenylquinoxaline, phenylenevinylene, phenylsilole and combinations thereof, each of which may have a substituent selected from the group consisting of a linear or branched alkyl group having 1 to 20 carbon atoms, a halogen atom, an alkoxy group having 1 to 20 carbon atoms, a cyano group and a nitro group; and the linking group is one or more kinds selected from the group consisting of a hydroxyl group, a sulfonic acid group, a sulfonamide group and functional groups represented by the following general formulae (1-a) to (1-l):

[Chemical Formula 2]

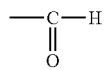  (1-a)

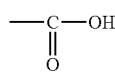  (1-b)

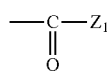  (1-c)

  (1-d)

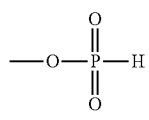  (1-e)

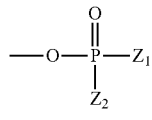  (1-f)

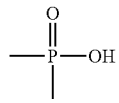  (1-g)

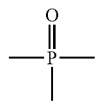  (1-h)

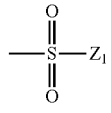  (1-i)

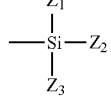  (1-j)

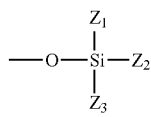  (1-k)

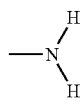  (1-l)

wherein each of $Z_1$, $Z_2$ and $Z_3$ independently represents a halogen atom or an alkoxy group.

3. The positive hole injection transport layer-forming ink according to claim 1, wherein the transition metal and the transition metal in the transition metal compound contained in the transition metal-containing nanoparticles are at least one kind of metal selected from the group consisting of molybdenum, tungsten, vanadium and rhenium.

4. The positive hole injection transport layer-forming ink according to claim 2, wherein the transition metal and the transition metal in the transition metal compound contained in the transition metal-containing nanoparticles are at least one kind of metal selected from the group consisting of molybdenum, tungsten, vanadium and rhenium.

5. The positive hole injection transport layer-forming ink according to claim 1, further comprising a positive hole transport compound.

6. The positive hole injection transport layer-forming ink according to claim 2, further comprising a positive hole transport compound.

* * * * *